US007280224B2

(12) United States Patent
Hill et al.

(10) Patent No.: US 7,280,224 B2
(45) Date of Patent: Oct. 9, 2007

(54) INTERFEROMETRY SYSTEMS AND METHODS OF USING INTERFEROMETRY SYSTEMS

(75) Inventors: Henry A. Hill, Tucson, AZ (US); Gary Womack, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 11/112,681

(22) Filed: Apr. 22, 2005

(65) Prior Publication Data

US 2005/0237536 A1    Oct. 27, 2005

Related U.S. Application Data

(60) Provisional application No. 60/564,448, filed on Apr. 22, 2004, provisional application No. 60/644,898, filed on Jan. 19, 2005.

(51) Int. Cl.
*G01B 9/02* (2006.01)
(52) U.S. Cl. ........................ 356/498; 356/511
(58) Field of Classification Search ................ 356/486, 356/487, 489, 492, 493, 498, 500, 508, 509, 356/511–516
See application file for complete search history.

(56) References Cited

U.S. PATENT DOCUMENTS

| 4,606,638 | A | 8/1986 | Sommargren |
| 4,662,750 | A | 5/1987 | Barger |
| 4,711,573 | A | 12/1987 | Wijntjes et al. |
| 4,790,651 | A | 12/1988 | Brown et al. |
| 4,802,765 | A | 2/1989 | Young et al. |
| 4,859,066 | A | 8/1989 | Sommargren |
| 4,881,816 | A | 11/1989 | Zanoni |
| 4,948,254 | A | 8/1990 | Ishida |
| 5,064,289 | A | 11/1991 | Bockman |
| 5,114,234 | A | 5/1992 | Otsuka et al. |
| 5,151,749 | A | 9/1992 | Tanimoto et al. |
| 5,187,543 | A | 2/1993 | Ebert |
| 5,331,400 | A | 7/1994 | Wilkening et al. |
| 5,363,196 | A | * | 11/1994 | Cameron ................... 356/500 |
| 5,404,222 | A | 4/1995 | Lis |

(Continued)

FOREIGN PATENT DOCUMENTS

JP          7-351078          12/1995

(Continued)

OTHER PUBLICATIONS

Bennett, S.J. "A Double-Passed Michelson Interferometer." Optics Communications, 4:6, pp. 428-430, 1972.

(Continued)

*Primary Examiner*—Gregory J. Toatley, Jr.
*Assistant Examiner*—Patrick J. Connolly
(74) *Attorney, Agent, or Firm*—Fish & Richardson P.C.

(57) ABSTRACT

In general, in one aspect, the invention features methods that include interferometrically monitoring a distance between an interferometry assembly and a measurement object along each of three different measurement axes while moving the measurement object relative to the interferometry assembly, determining values of a parameter for different positions of the measurement object from the monitored distances, wherein for a given position the parameter is based on the distances of the measurement object along each of the three different measurement axes at the given position, and deriving information about a surface figure profile of the measurement object from a frequency transform of at least the parameter values.

32 Claims, 9 Drawing Sheets

U.S. PATENT DOCUMENTS

| | | | |
|---|---|---|---|
| 5,408,318 A | 4/1995 | Slater | |
| 5,483,343 A | 1/1996 | Iwamoto et al. | |
| 5,491,550 A | 2/1996 | Dabbs | |
| 5,663,793 A | 9/1997 | de Groot | |
| 5,663,893 A | 9/1997 | Wampler et al. | |
| 5,715,057 A | 2/1998 | Bechstein et al. | |
| 5,724,136 A | 3/1998 | Zanoni | |
| 5,757,160 A | 5/1998 | Kreuzer | |
| 5,757,489 A | 5/1998 | Kawakami | |
| 5,764,361 A | 6/1998 | Kato et al. | |
| 5,764,362 A | 6/1998 | Hill et al. | |
| 5,781,277 A | 7/1998 | Iwamoto | |
| 5,790,253 A * | 8/1998 | Kamiya | 356/500 |
| 5,801,832 A | 9/1998 | Van Den Brink | |
| 5,838,485 A | 11/1998 | De Groot et al. | |
| 5,862,164 A | 1/1999 | Hill | |
| 5,877,843 A | 3/1999 | Takagi et al. | |
| 5,917,844 A | 6/1999 | Hill | |
| 5,951,482 A | 9/1999 | Winston et al. | |
| 5,970,077 A | 10/1999 | Hill | |
| 5,991,033 A | 11/1999 | Henshaw et al. | |
| 6,008,902 A | 12/1999 | Rinn | |
| 6,020,964 A | 2/2000 | Loopstra et al. | |
| 6,040,096 A | 3/2000 | Kakizaki | |
| 6,046,792 A | 4/2000 | Van Der Werf et al. | |
| 6,124,931 A | 9/2000 | Hill | |
| 6,134,007 A | 10/2000 | Naraki et al. | |
| 6,137,574 A | 10/2000 | Hill | |
| 6,157,660 A | 12/2000 | Hill | |
| 6,159,644 A | 12/2000 | Hidetoshi | |
| 6,160,619 A | 12/2000 | Magome | |
| 6,181,420 B1 | 1/2001 | Badami et al. | |
| 6,201,609 B1 | 3/2001 | Hill et al. | |
| 6,208,424 B1 | 3/2001 | de Groot | |
| 6,219,144 B1 | 4/2001 | Hill | |
| 6,236,507 B1 | 5/2001 | Hill et al. | |
| 6,246,481 B1 | 6/2001 | Hill | |
| 6,252,667 B1 | 6/2001 | Hill | |
| 6,252,668 B1 | 6/2001 | Hill | |
| 6,271,923 B1 | 8/2001 | Hill | |
| 6,304,318 B1 | 10/2001 | Matsumoto | |
| 6,313,918 B1 | 11/2001 | Hill et al. | |
| 6,327,039 B1 | 12/2001 | de Groot et al. | |
| 6,330,065 B1 | 12/2001 | Hill | |
| 6,330,105 B1 | 12/2001 | Rozelle et al. | |
| 6,384,899 B1 | 5/2002 | den Boef | |
| 6,417,927 B2 | 7/2002 | De Groot | |
| 6,541,759 B1 | 4/2003 | Hill | |
| 6,700,665 B2 * | 3/2004 | Hill | 356/500 |
| 6,710,884 B2 * | 3/2004 | Hill | 356/498 |
| 6,738,143 B2 | 5/2004 | Chu | |
| 6,757,066 B2 | 6/2004 | Hill | |
| 6,813,022 B2 * | 11/2004 | Inoue | 356/399 |
| 6,839,141 B2 | 1/2005 | Hill | |
| 6,917,432 B2 | 7/2005 | Hill et al. | |
| 2001/0035959 A1 * | 11/2001 | Hill | 356/500 |
| 2002/0001086 A1 | 1/2002 | De Groot | |
| 2002/0048026 A1 | 4/2002 | Isshiki et al. | |
| 2002/0089671 A1 | 7/2002 | Hill | |
| 2003/0035114 A1 * | 2/2003 | Hill | 356/500 |
| 2003/0090675 A1 * | 5/2003 | Fujiwara | 356/500 |
| 2004/0046965 A1 * | 3/2004 | Hill | 356/500 |
| 2005/0146727 A1 * | 7/2005 | Hill | 356/498 |
| 2005/0248772 A1 * | 11/2005 | Hill et al. | 356/500 |
| 2006/0187464 A1 * | 8/2006 | Womack et al. | 356/500 |

FOREIGN PATENT DOCUMENTS

| | | |
|---|---|---|
| JP | 8-117083 | 4/1996 |
| JP | 9-178415 | 7/1997 |
| JP | 9-280822 | 10/1997 |
| JP | 10-260009 | 9/1998 |
| WO | 01-90686 | 11/2001 |
| WO | WO 01/90686 | 11/2001 |
| WO | 05/013711 | 2/2005 |

OTHER PUBLICATIONS

Hines et al. Sub-Nonometer Laser Metrology—Some Techniques and Models. ESO Conference on High-Resolution Imaging by Interferometry II, pp. 1195-1204, 1991.

Bobroff, Norman. "Recent advances in displacement measuring interferometry." Meas. Sci. Technol. 4, pp. 907-926, 1993.

Oka et al. "Polarization heterodyne interferometry using another local oscillator beam." Optics Communications, 92, pp. 1-5, 1992.

Mauer, Paul. "Phase Compensation of Total Internal Reflection." J. Opt. Soc. Am., 56:9, pp. 1219-1221, 1966/.

Player, M.A. "Polarization properties of a cube-corner reflector." J. Mod. Opt., 35:11, pp. 1813-1820, 1988.

Badami et al. "Investigation of Nonlinearity in High Accuracy Heterodyne Laser Interferometry." American Society for Precision Engineering, 1997 Proceedings, 16, pp. 153-156, 1997.

Bobroff, Norman. "Residual errors in laser interferometry from air turbulence and nonlinearity." Applied Optics, 26:13, pp. 2676-2686, 1987.

Wu et al., "Analytical modeling of the periodic nonlinearity in heterodyne interferometry." Applied Optics, 37:28, pp. 6696-6700, 1998.

Badami et al. "Investigation of Nonlinearity in High Accuracy Heterodyne Laser Interferometry." American Society for Precision Engineering, 1997 Proceedings, 16, pp. 153-156, 1997.

Bobroff, Norman. "Residual errors in laser interferometry from air turbulence and nonlinearity." Applied Optics, 26:13, pp. 2676-2686, 1987.

Wu et al., "Analytical modeling of the periodic nonlinearity in heterodyne interferometry." Applied Optics, 37:28, pp. 6696-6700, 1998.

* cited by examiner

INTERFEROMETRY SYSTEMS AND METHODS OF USING INTERFEROMETRY SYSTEMS

CROSS-REFERENCE TO RELATED APPLICATIONS

This application claims priority under 35 USC §119(e)(1) to Provisional Patent Application No. 60/564,448, entitled "MULTI-AXIS INTERFEROMETER AND DATA PROCESSING FOR MIRROR MAPPING," filed on Apr. 22, 2004 and to Provisional Patent Application No. 60/644,898, entitled "MULTI-AXIS INTERFEROMETER AND DATA PROCESSING FOR MIRROR MAPPING" filed on Jan. 19, 2005. The entire contents of Provisional Patent Application Nos. 60/564,448 and 60/644,898 are hereby incorporated by reference.

BACKGROUND

This invention relates to interferometry systems and methods of using interferometry systems.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the phase of the measured interference signal correspond to changes in the relative position of the measurement object, e.g., a change in phase of $2\pi$ corresponds substantially to a distance change d of $\lambda/(2np)$. Distance 2d is a round-trip distance change or the change in distance to and from a stage that includes the measurement object. In other words, the phase Φ, ideally, is directly proportional to d, and can be expressed as $$\Phi = 20pkd, \text{ where } k = \frac{2\pi n}{\lambda}. \tag{1}$$

Unfortunately, the observable interference phase, $\tilde{\Phi}$, is not always identically equal to phase Φ. Many interferometers include, for example, non-linearities such as "cyclic errors." Cyclic errors can be expressed as contributions to the observable phase and/or the intensity of the measured interference signal and have a sinusoidal dependence on the change in for example optical path length 2pnd. In particular, a first order cyclic error in phase has for the example a sinusoidal dependence on $(4\pi pnd)/\lambda$ and a second order cyclic error in phase has for the example a sinusoidal dependence on $2(4\pi pnd)/\lambda$. Higher order cyclic errors can also be present as well as sub-harmonic cyclic errors and cyclic errors that have a sinusoidal dependence of other phase parameters of an interferometer system comprising detectors and signal processing electronics. Different techniques for quantifying such cyclic errors are described in commonly owned U.S. Pat. No. 6,137,574, U.S. Pat. No. 6,252,688, and U.S. Pat. No. 6,246,481 by Henry A. Hill.

In addition to cyclic errors, there are other sources of deviations in the observable interference phase from Φ, such as, for example, non-cyclic non-linearities or non-cyclic errors. One example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kumit, A. Szöke, F. Zemike, P. H. Lee, and A. Javan, "Accurate Laser Wavelength Measurement With A Precision Two-Beam Scanning Michelson Interferometer," *Applied Optics*, 20(5), 736–757, 1981.

A second source of non-cyclic errors is the effect of "beam shearing" of optical beams across interferometer elements and the lateral shearing of reference and measurement beams one with respect to the other. Beam shears can be caused, for example, by a change in direction of propagation of the input beam to an interferometer or a change in orientation of the object mirror in a double pass plane mirror interferometer such as a differential plane mirror interferometer (DPMI) or a high stability plane mirror interferometer (HSPMI).

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

The interferometers described above are often components of metrology systems in scanners and steppers used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, e.g., a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

In many lithography systems and other applications, the measurement object includes one or more plane mirrors to reflect the measurement beam from each interferometer. Small changes in the angular orientation of the measurement object, e.g., corresponding to changes in the pitching and/or yaw of a stage, can alter the direction of each measurement beam reflected from the plane mirrors. If left uncompensated, the altered measurement and reference beams reduce the overlap of the exit measurement and reference beams in each corresponding interferometer. Furthermore, these exit measurement and reference beams will not be propagating parallel to one another nor will their wave fronts be aligned when forming the mixed beam. As a result, the interference between the exit measurement and reference beams will vary across the transverse profile of the mixed beam, thereby corrupting the interference information encoded in the optical intensity measured by the detector.

To address this problem, many conventional interferometers include a retroreflector that redirects the measurement beam back to the plane mirror so that the measurement beam "double passes" the path between the interferometer and the measurement object. The presence of the retroreflector insures that the direction of the exit measurement is insensitive to changes in the angular orientation of the measurement object. When implemented in a plane mirror interferometer, the configuration results in what is commonly referred to as a high-stability plane mirror interferometer (HSPMI). However, even with the retroreflector, the lateral position of the exit measurement beam remains sensitive to changes in the angular orientation of the measurement object. Furthermore, the path of the measurement beam through optics within the interferometer also remains sensitive to changes in the angular orientation of the measurement object.

In practice, the interferometry systems are used to measure the position of the wafer stage along multiple measurement axes. For example, defining a Cartesian coordinate system in which the wafer stage lies in the x-y plane, measurements are typically made of the x and y positions of the stage as well as the angular orientation of the stage with respect to the z axis, as the wafer stage is translated along the x-y plane. Furthermore, it may be desirable to also monitor tilts of the wafer stage out of the x-y plane. For example, accurate characterization of such tilts may be necessary to calculate Abbé offset errors in the x and y positions. Thus, depending on the desired application, there may be up to five degrees of freedom to be measured. Moreover, in some applications, it is desirable to also monitor the position of the stage with respect to the z-axis, resulting in a sixth degree of freedom.

To measure each degree of freedom, an interferometer is used to monitor distance changes along a corresponding metrology axis. For example, in systems that measure the x and y positions of the stage as well as the angular orientation of the stage with respect to the x, y, and z axes, at least three spatially separated measurement beams reflect from one side of the wafer stage and at least two spatially separated measurement beams reflect from another side of the wafer stage. See, e.g., U.S. Pat. No. 5,801,832 entitled "METHOD OF AND DEVICE FOR REPETITIVELY IMAGING A MASK PATTERN ON A SUBSTRATE USING FIVE MEASURING AXES," the contents of which are incorporated herein by reference. Each measurement beam is recombined with a reference beam to monitor optical path length changes along the corresponding metrology axes. Because the different measurement beams contact the wafer stage at different locations, the angular orientation of the wafer stage can then be derived from appropriate combinations of the optical path length measurements. Accordingly, for each degree of freedom to be monitored, the system includes at least one measurement beam that contacts the wafer stage. Furthermore, as described above, each measurement beam may double-pass the wafer stage to prevent changes in the angular orientation of the wafer stage from corrupting the interferometric signal. The measurement beams may be generated from physically separate interferometers or from multi-axes interferometers that generate multiple measurement beams.

SUMMARY

In general, in one aspect, the invention features methods that include interferometrically monitoring a distance between an interferometry assembly and a measurement object along each of three different measurement axes while moving the measurement object relative to the interferometry assembly, determining values of a first parameter and a second parameter for different positions of the measurement object from the monitored distances, wherein for a given position the first parameter is based on the monitored distances of the measurement object along each of the three different measurement axes at the given position, and for a given position the second parameter is based on the monitored distance of the measurement object along each of two of the measurement axes at the given position, and deriving information about a surface figure profile of the measurement object from the first and second parameter values.

Implementations of the methods can include one or more of the following features and/or features of other aspects of the invention.

The second parameter can also be based on the monitored distance of the measurement object along one of the measurement axes at another position. Monitoring the distance between the interferometry assembly and the measurement object can include simultaneously measuring a location of the measurement object along each of the measurement axes for each of the different positions of the measurement object. Determining the value of the second parameter for each position of the measurement object can include calculating a difference between the monitored distance along two of the measurement axes for multiple different positions of the measurement object.

The methods can further include determining values of a third parameter for different positions of the measurement object, wherein for each position the third parameter is based on the distance of the measurement object along each of two of the measurement axes at that position and the distance of the measurement object along one of the measurement axes at another position. The information about the surface figure profile of the measurement object can be derived also from the third parameter values. The values of the first parameter can be determined for a first range of positions of the measurement object, the values of the second parameter can be determined for a second range of positions of the measurement object, and the values of the third parameter can be determined for a third range of positions of the measurement object. The first, second, and third ranges of positions of the measurement object can be different. Deriving information about the surface figure profile of the measurement object can include determining Fourier coefficients for a function characterizing the surface figure profile. The Fourier coefficients can be determined from a Fourier transform (e.g., a discrete Fourier transform) of the values of the first, second, and third parameters corrected for boundary offsets between the first, second, and third parameter values. The first parameter can be a second difference parameter (SDP). The second and third parameters can be extended second difference parameters ($SDP^e$). In some embodiments, the first parameter is given by an expression including $$[x_j(y)-x_i(y)]-\eta[x_j(y)-x_j(y)],$$

where $x_n$ corresponds to the distance between the interferometry assembly and the measurement position along the n-th measurement axis at position y with n=i, j, k, for i≠j≠k and $\eta$ is a non-zero constant. $\eta$ can be selected so that the values of the expression are not sensitive to second order to rotations of the measurement object about an axis orthogonal to at least one of the three measurement axes. $\eta$ can correspond to a ratio of separation distances between the measurement axes. The second parameter can be given by an expression comprising $$[x_j(y')-x_i(y)]+\eta[x_j(y)-x_i(y-y')],$$

where y' is a non-zero constant. The third parameter can be given by an expression comprising $$[x_k(y+y'')-x_j(y)]+\eta[x_k(y)-x_j(y)],$$

where y'' is a non-zero constant.

The methods can further include monitoring an orientation of the measurement object with respect to the measurement axes while moving the measurement object relative to the interferometry assembly. Determining values of the second parameter can include accounting for variations in the orientation of the measurement object.

The measurement axes can be co-planar. In some embodiments, the measurement axes are parallel. The relative movement of the measurement object can be in a direction non-parallel to at least one of the measurement axes. The direction can be orthogonal to at least one of the measurement axes.

The methods can further include interferometrically monitoring the position of the measurement object while moving the measurement object relative to the interferometry assembly. Interferometrically monitoring the position of the measurement object can include monitoring a distance between another interferometry assembly and a second measurement object along a further axis non-parallel to at least one of the three different measurement axes. The further axis can be substantially orthogonal to at least one of the three different measurement axes.

The methods can also include using the information about the surface figure profile of the measurement object to improve the accuracy of measurements made using the interferometry assembly.

In some embodiments, the methods include using a lithography tool to expose a substrate with radiation passing through a mask while interferometrically monitoring the distance between the interferometry assembly and the measurement object, wherein the position of the substrate or the mask relative to a reference frame is related to the distance between the interferometry assembly and the measurement object. The measurement object can be attached to a wafer stage configured to support the wafer.

The measurement object can be a plane mirror measurement object. The interferometer assembly or the measurement object can be attached to a stage and at least one of the monitored distances is used to monitor the position of the stage relative to a frame supporting the stage.

The methods can include using the information about the surface figure profile of the measurement object to improve the accuracy of subsequent measurements made using the measurement object.

In another aspect, the invention features lithography methods for use in fabricating integrated circuits on a wafer, the methods include supporting the wafer on a moveable stage, imaging spatially patterned radiation onto the wafer, adjusting the position of the stage, and monitoring the position of the stage using the measurement object and using the information about the surface figure profile of the measurement object derived using methods disclosed herein to improve the accuracy of the monitored position of the stage.

In a further aspect, the invention features lithography methods for use in the fabrication of integrated circuits including directing input radiation through a mask to produce spatially patterned radiation, positioning the mask relative to the input radiation, monitoring the position of the mask relative to the input radiation using the measurement object and using the information about the surface figure profile of the measurement object derived using methods disclosed herein to improve the accuracy of the monitored position of the mask, and imaging the spatially patterned radiation onto a wafer.

In another aspect, the invention features lithography methods for fabricating integrated circuits on a wafer including positioning a first component of a lithography system relative to a second component of a lithography system to expose the wafer to spatially patterned radiation, and monitoring the position of the first component relative to the second component using the measurement object and using the information about the surface figure profile of the measurement object derived using methods disclosed herein to improve the accuracy of the monitored position of the first component.

In yet a further aspect, the invention features methods for fabricating integrated circuits including one or more of the aforementioned lithography methods.

In another aspect, the invention features methods for fabricating a lithography mask that include directing a write beam to a substrate to pattern the substrate, positioning the substrate relative to the write beam, and monitoring the position of the substrate relative to the write beam using the measurement object and using the information about the surface figure profile of the measurement object derived using methods disclosed herein to improve the accuracy of the monitored position of the substrate.

In general, in another aspect, the invention features methods that include interferometrically monitoring a distance between an interferometry assembly and a measurement object along each of three different measurement axes while moving the measurement object relative to the interferometry assembly, determining values of a parameter for different positions of the measurement object from the monitored distances, wherein for a given position the parameter is based on the distances of the measurement object along each of the three different measurement axes at the given position, and deriving information about a surface figure profile of the measurement object from a frequency transform of at least the parameter values.

Implementations of the methods can include one or more of the following features and/or features of other aspects of the invention.

The frequency transform can be a Fourier transform (e.g., a discrete Fourier transform). The information about the surface figure profile can be derived from a frequency transform of values of a second parameter, wherein for a given position the second parameter is based on the monitored distances of the measurement object along each of two of the measurement axes at the given position and the monitored distance of the measurement object along one of the measurement axes at another position.

In general, in another aspect, the invention features apparatus that include a interferometer assembly configured to produce three output beams each including interferometric information about a distance between the interferometer and a measurement object along a respective axis, and an electronic processor configured to determine values of a first parameter and a second parameter for different positions of the measurement object from the interferometric information, wherein for a given position the first parameter is based on the distances of the measurement object along each of the respective measurement axes at the given position, and for a given position the second parameter is based on the monitored distance of the measurement object along two of the respective measurement axes at the given position and the monitored distance of the measurement object along one of the respective measurement axes at another position, the electronic processor being further configured to derive information about a surface figure profile of the measurement object from the interferometric information.

Embodiments of the apparatus can include one or more of the following features and/or features of other aspects of the invention.

The measurement object can be a plane mirror measurement object. The three output beams can each include a component that makes one pass to the measurement object along a common beam path. The measurement axes can be co-planar and/or parallel.

In some embodiments, the apparatus further includes a stage, wherein the interferometer assembly or measurement object are attached to the stage.

In another aspect, the invention features lithography systems for use in fabricating integrated circuits on a wafer, where the systems include a stage for supporting the wafer, an illumination system for imaging spatially patterned radiation onto the wafer, a positioning system for adjusting the position of the stage relative to the imaged radiation, and apparatus disclosed herein for monitoring the position of the wafer relative to the imaged radiation.

In general, in another aspect, the invention features lithography systems for use in fabricating integrated circuits on a wafer, where the systems include a stage for supporting the wafer, and an illumination system including a radiation source, a mask, a positioning system, a lens assembly, and apparatus disclosed herein, wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

In another aspect, the invention features a beam writing systems for use in fabricating a lithography mask, where the beam writing systems include a source providing a write beam to pattern a substrate, a stage supporting the substrate, a beam directing assembly for delivering the write beam to the substrate, a positioning system for positioning the stage and beam directing assembly relative one another, and apparatus disclosed herein for monitoring the position of the stage relative to the beam directing assembly.

In other aspects, the invention features methods for fabricating integrated circuits that include using lithography systems disclosed herein. In general, in a further aspect, the invention features apparatus that include an interferometer assembly configured to produce three output beams each including interferometric information about a distance between the interferometer and a measurement object along a respective axis, and an electronic processor configured to determine values of a parameter or different positions of the measurement object from the interferometric information, wherein for a given position the parameter is based on the distances of the measurement object along each of the respective measurement axes at the given position, the electronic processor being further configured to derive information about a surface figure profile of the measurement object from a frequency transform of at least the parameter values. Embodiments of the apparatus can include features of other aspects of the invention.

In general, in yet another aspect, the invention features methods that include interferometrically monitoring a distance between an interferometry assembly and a measurement object along each of three different measurement axes while moving the measurement object relative to the interferometry assembly, determining values of a first parameter for different positions of the measurement object from the monitored distances, wherein for a given position the first parameter based on the monitored distance of the measurement object along each of two of the measurement axes at the given position and on the monitored distance of the measurement object along one of the measurement axes at another position, and deriving information about a surface figure profile of the measurement object from the first parameter values. Embodiments of the methods can include features of other aspects of the invention.

Embodiments of the invention can include one or more of the following advantages.

Embodiments include methods for accurately determining a surface figure error function of a measurement object using an interferometry assembly. Where the interferometry system forms part of a metrology system in a lithography tool, the interferometry system can provide in situ measurements of measurement objects used by the metrology system which can reduce tool downtime needed in order to calibrate the metrology system. For example, the surface figure error function of a stage mirror in a lithography tool can be monitored or measured while the tool is being used to expose a wafer.

The invention further provides methods for accurately determining a surface figure error function of a measurement object by performing a frequency transform of a parameter related to the second derivative of the surface figure error function that can be measured using a multi-axis interferometer. The methods include determining parameters that allow use of an orthogonal set of basis functions corresponding to the portion of the measurement object being characterized, allowing frequency transform methods to be used.

Beams and/or axes referred to as being parallel or nominally parallel may deviate from being perfectly parallel to the extent that the effect of the deviation on a measurement is negligible (e.g., less than the required measurement accuracy by about an order of magnitude or more) or otherwise compensated.

Beams and/or axes referred to as being coplanar or nominally coplanar may deviate from being perfectly coplanar to the extent that the effect of the deviation on a measurement is negligible (e.g., less than the required measurement accuracy by about an order of magnitude or more) or otherwise compensated.

Beams and/or axes referred to as being orthogonal or nominally orthogonal may deviate from being perfectly orthogonal to the extent that the effect of the deviation on a measurement is negligible (e.g., less than the required measurement accuracy by about an order of magnitude or more) or otherwise compensated.

Unless otherwise defined, all technical and scientific terms used herein have the same meaning as commonly understood by one of ordinary skill in the art to which this invention belongs. A number of references are incorporated herein by reference. In case of conflict, the present specification will control.

Other features and advantages of the invention will be apparent from the following detailed description.

BRIEF DESCRIPTION OF THE DRAWINGS

Like reference symbols in the various drawings indicate like elements.

DETAILED DESCRIPTION

Figure 1A:
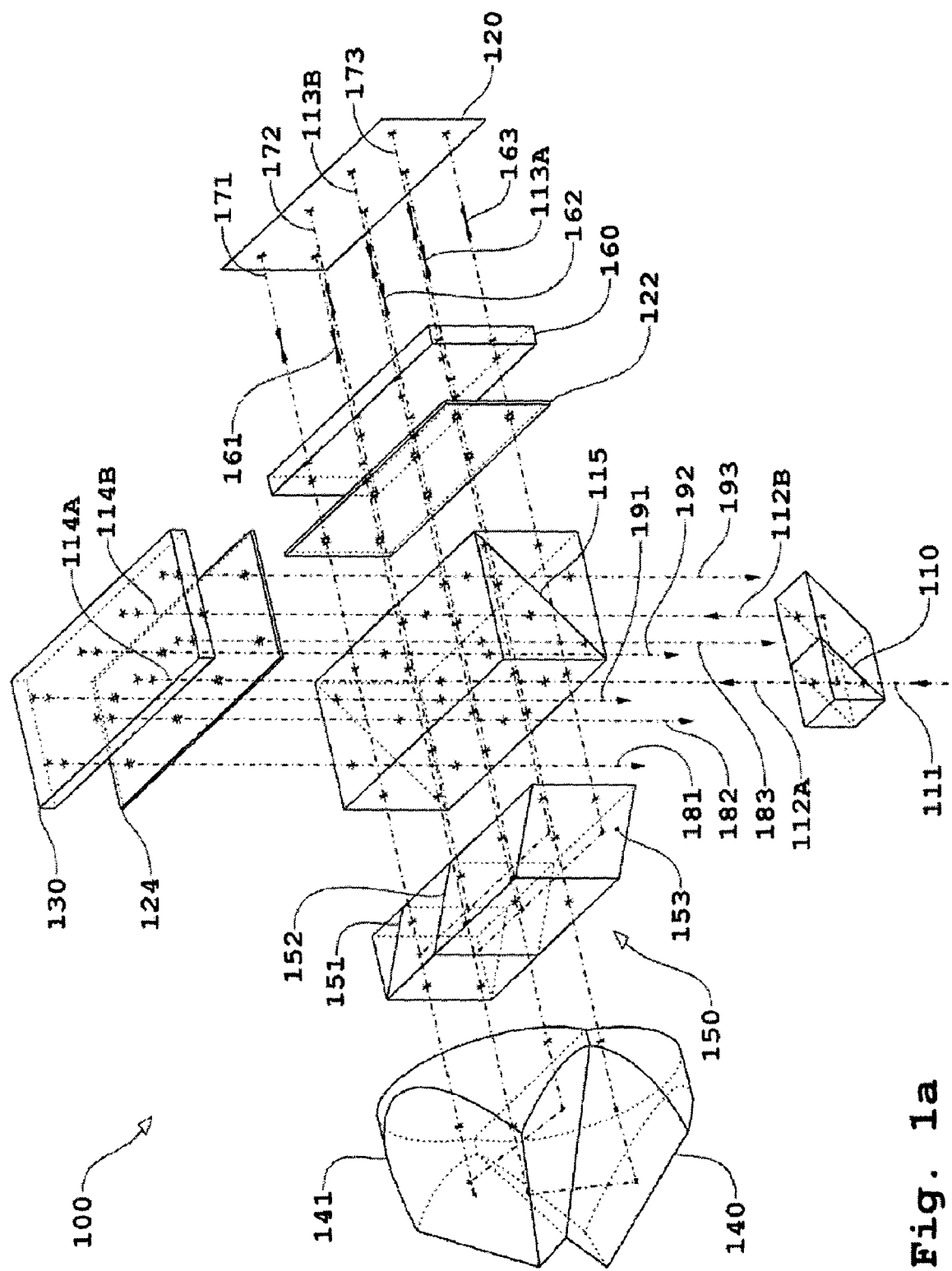
FIG. 1a is a perspective drawing of an interferometer system comprising two three-axis/plane interferometers.

In addition to the sources of interferometer measurement errors discussed previously, another source of measurement error in certain displacement measurement interferometry systems are variations in the surface of a plane mirror measurement object. These variations cause the mirror surface to deviate from being perfectly planar.

Errors in interferometry systems that use plane mirror measurement objects can be reduced where a surface figure of the mirror is known. Knowledge of the surface figures allows the system to compensate for the variations in the surface figure from an ideal mirror. However, the surface figure of plane mirrors can vary with time, so the accuracy of the interferometry system measurements can degrade over the system's lifetime. Accordingly, the surface figures of the mirrors used in a metrology system should be re-measured periodically to maintain system accuracy.

Accurate knowledge of the surface figure of a plane mirror measurement object can be particularly beneficial where metrology systems are used in applications with high accuracy requirements. An example of such an application is in lithography tools where metrology systems are used to monitor the position of stages that support a wafer or a mask within the tool. In some embodiments, ex situ measurement methods can be used to determine information about the surface figure of a mirror. In these methods, the mirror is removed from the lithography tool and measured using another piece of apparatus. However, the metrology system cannot be used until the mirror is replaced, so the tool is generally unproductive during such maintenance. Furthermore, the surface figure of a mirror can change when the tool is reinserted into the tool (e.g., as a result of stresses associated with the mechanical attachment of the mirror to the tool), introducing unaccounted sources of error into the metrology system.

In situ measurement methods can mitigate these errors because the surface figure is measured while it is attached to the tool, after the mirror has adapted to stresses associated with its attachment to the tool. Moreover, in situ methods can improve tool throughput by reducing the amount of time a tool is offline for servicing.

In this application, interferometry systems and methods are disclosed in which information about a surface figure of a mirror can be obtained in a lithography tool during the operation of the tool or while the tool is offline. More generally, the systems and methods are not limited to use in lithography tools, and can be used in other applications as well (e.g., in beam writing systems).

In embodiments, procedures for determining information about a surface figure of a stage mirror includes measuring values of a second difference parameter (SDP) for the mirror. The SDP of a mirror can be expressed as a series of orthogonal basis functions (e.g., a Fourier series), where the coefficients (e.g., Fourier coefficients) of the series are related by a transfer function to corresponding coefficients of a series representation of a mirror surface figure error function, $\xi$.

However, the SDP function is not necessarily mathematically invertible to obtain a complete set of orthogonal basis functions used in a series representation. Accordingly, additional functions are defined that, together with the SDP, allow use of a set of orthogonal basis functions which permit inversion of the SDP to a conjugate (e.g., spatial frequency) domain. These additional functions are referred to as extended SDP-related parameters ($SDP^e$s).

Before discussing the mathematical details of inverting a SDP to obtain $\xi$, a description of an apparatus is presented that can be used to acquire data from which SDP and $SDP^e$ values can be calculated. Measurements of SDP values and $SDP^e$ values can be made using a multi-axis/plane interferometer. FIG. 1a shows an embodiment of a multi-axis plane mirror interferometer 100, which directs multiple measurement beams to each contact a measurement object 120 (e.g., a plane mirror measurement object) twice. Interferometer 100 produces multiple output beams 181–183 and 191–193 each including interferometric information about changes in distance between the interferometry system and the measurement object along a corresponding measurement axis.

Interferometer 100 has the property that the output beams each includes a measurement component that makes one pass to the measurement object along one of two common measurement beam paths before being directed along separate measurement beam paths for the second pass to the measurement object. Similar interferometers are disclosed in commonly owned U.S. patent application Ser. No. 10/351,707 by Henry, A. Hill filed Jan. 27, 2003 and entitled "MULTIPLE DEGREE OF FREEDOM INTERFEROMETER," the contents of which are incorporated herein by reference.

Interferometer 100 includes a non-polarizing beam splitter 110, which splits a primary input beam 111 into two secondary input beams 112A and 112B. Interferometer 100 also includes a polarizing beam splitter 115, which splits secondary input beams 112A and 112B into primary measurement beams 113A and 113B, and primary reference beams 114A and 114B, respectively. Interferometer 100 directs primary measurement beams 113A and 113B along paths that contact measurement object 120 at different locations in a vertical direction. Similarly, primary reference beams 114A and 114B are directed along reference beam paths that contact a reference mirror 130 at different locations. Interferometer 100 also includes quarter wave plates 122 and 124. Quarter wave plate 122 is located between polarizing beam splitter 115 and measurement object 120, while quarter wave plate 124 is located between polarizing beam splitter 115 and the reference mirror. The quarter wave plates rotate by 90° the polarization state of double passed beams directed between the polarizing beam splitter and the measurement object or reference mirror. Accordingly, the polarizing beam splitter transmits an incoming beam that would have been reflected in its out-going polarization state.

The following description pertains to primary measurement beam 113A and primary reference beam 114A. Interferometer 100 directs measurement beam 113B and reference beam 114B along analogous paths. Polarizing beam splitter (PBS) 115 transmits reflected primary measurement beam 113B, which is reflected back towards PBS 115 by a retroreflector 140 (a similar retroreflector 141 reflects primary measurement beam 113B). A compound optical component 150 including non-polarizing beam splitters 151 and 152 and reflector 153 split primary measurement beam 113A into three secondary measurement beams 161, 162, and 163. PBS 115 transmits the three secondary measurement beams, which propagate along paths that contact measurement object 120 at three different positions in a horizontal plane shared by primary measurement beam 113A. PBS 115 then directs the three secondary measurement beams reflected from measurement object 120 along output paths.

PBS 115 reflects primary reference beam 114A towards retroreflector 140. As for the primary measurement beam, optical component 150 splits primary reference beam 114A reflected by retroreflector 140 into three secondary reference beams 171, 172, and 173. PBS 115 reflects secondary reference beams 171, 172, and 173 towards reference mirror 130 along paths at three different positions in a plane shared by primary reference beam 114A. PBS 115 transmits secondary reference beams 171, 172, and 173 reflected from reference object 130 along output paths so that they overlap with measurement beams 161, 162, and 163 to form output beams 181, 182, and 183, respectively. The phase of the output beams carries information about the position of the measurement object along three measurement axes defined by the primary measurement beam's path and the secondary measurement beams' paths.

Interferometer 100 also includes a window 160 located between quarter wave plate 122 and measurement object 120.

Figure 1B:
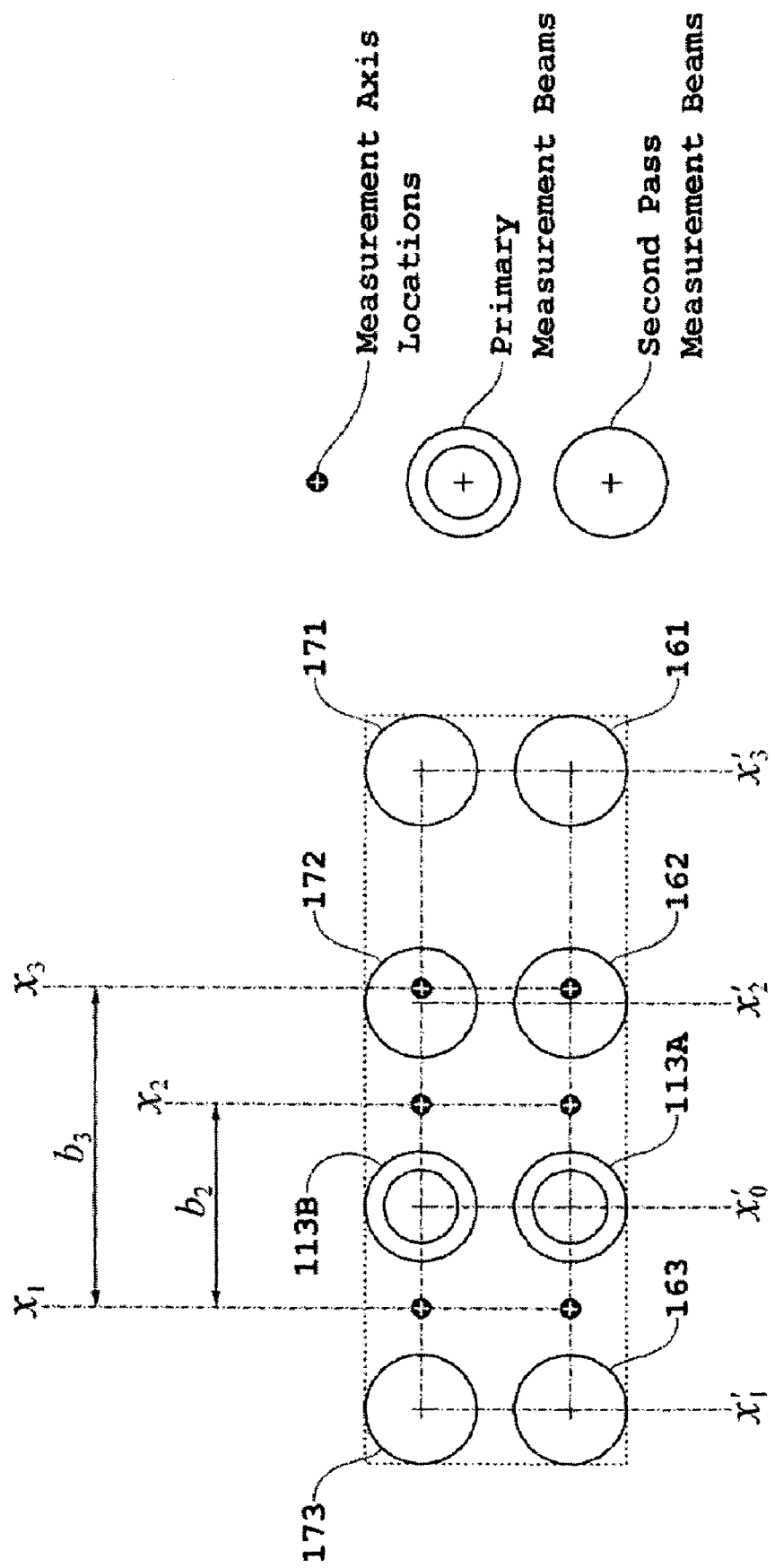
FIG. 1b is a diagram that shows the pattern of measurement beams from interferometer system of FIG. 1a at a stage mirror that serves as measurement object for interferometers of the interferometer system.

The pattern of measurement beams incident on a plane mirror measurement object is shown in FIG. 1b. The angle of incidence of measurement beams at the mirror surface is nominally zero when the measurement axes are parallel to the x-axis of a coordinate system. The locations of the measurement axes of the top multiple-axis/plane interferometer corresponding to $x_1$, $x_2$, and $x_3$ are shown in FIG. 1b. The spacings between measurement axes corresponding to $x_1$ and $x_2$ and to $x_1$ and $x_3$ are $b_2$ and $b_3$, respectively. In general, $b_2$ and $b_3$ can vary as desired. $b_2$ can be the same as or different from $(b_3-b_2)$. In some embodiments, the axis spacing can be relatively narrow (e.g., about 10 cm or less, about 5 cm or less, about 3 cm or less, about 2 cm or less). For example, where the resolution of a measurement depends on the spacing the axes, having relatively narrow spacing between at least two of the measurement axes can provide increased sensitivity to higher frequencies in a measurement.

Also shown in FIG. 1b is the location corresponding to the primary single pass measurement beam $x'_0$ and the locations corresponding to the second pass measurement beams $x'_1$, $x'_2$, and $x'_3$. The relationship between a linear displacement measurement corresponding to a double pass to the stage mirror and the linear displacement measurements corresponding to a single pass to the stage mirror is given by $$x_j = \frac{1}{2}(x'_j + x'_0), \quad j = 1, 2, \text{ and } 3. \tag{2}$$

The difference between two linear displacements $x_i$ and $x_j$, $i \neq j$, referred to as a first difference parameter (FDP) is independent of $x'_0$, i.e., $$x_i - x_j = \frac{1}{2}(x'_i - x'_j), \quad i, j = 1, 2, \text{ and } 3, \quad i \neq j. \tag{3}$$

Figure 2A:
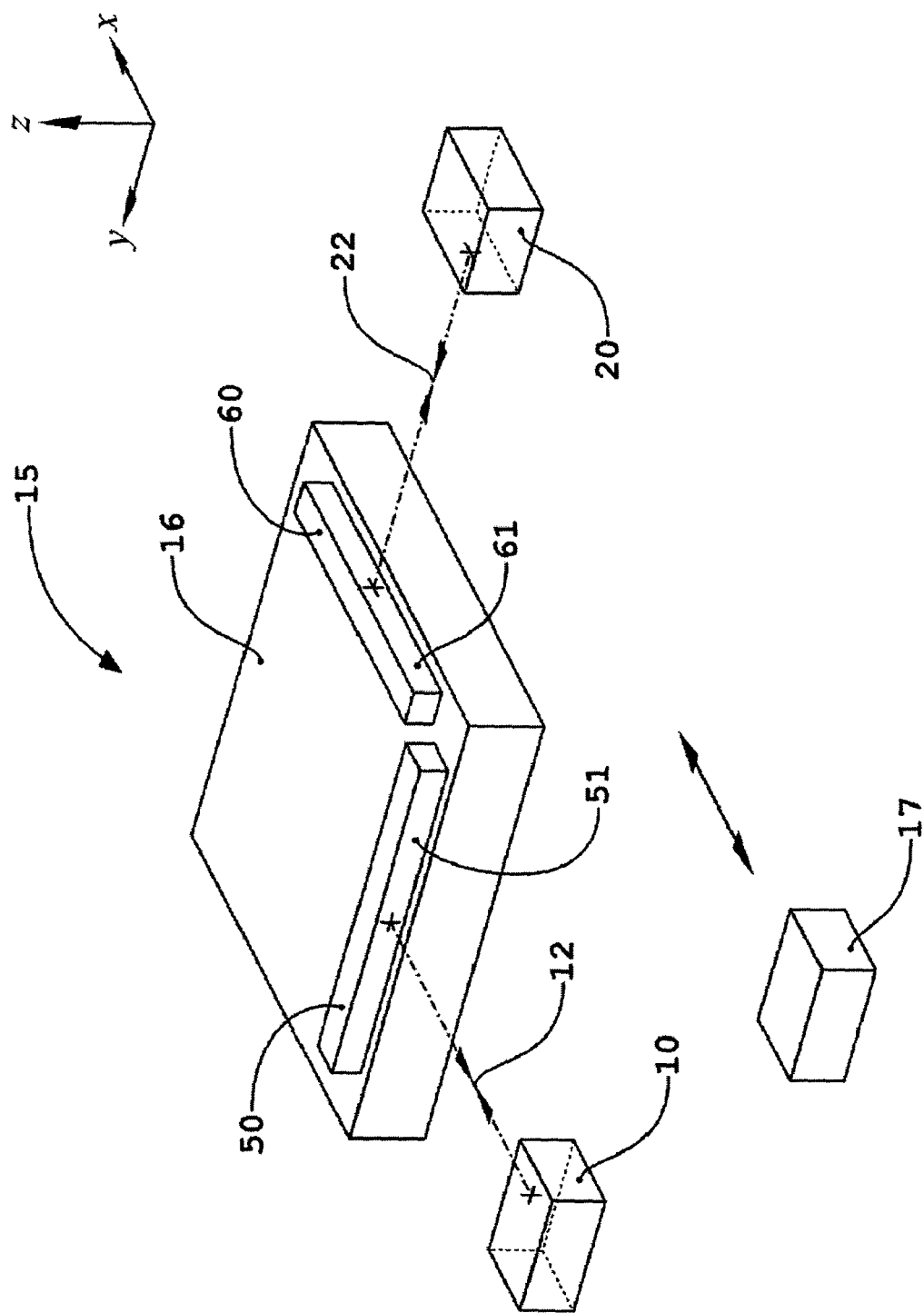
FIG. 2a is a diagrammatic perspective view of an interferometer system.

Reference is made to FIG. 2 which is a diagrammatic perspective view of an interferometry system 15 that employs a pair of orthogonally arranged interferometers or interferometer subsystems by which the shape of on-stage mounted stage mirrors may be characterized in situ along one or more datum lines. As shown in FIG. 2, system 15 includes a stage 16 that can form part of a microlithography tool. Affixed to stage 16 is a plane stage mirror 50 having a y-z reflective surface 51 elongated in the y-direction.

Also, affixed to stage 16 is another plane stage mirror 60 having an x-z reflective surface 61 elongated in the x-direction. Mirrors 50 and 60 are mounted on stage 16 so that their reflective surfaces, 51 and 61, respectively, are nominally orthogonal to one another. Stage 16 is otherwise mounted for translations nominally in the x-y plane but may experience small angular rotations about the x, y, and z axes due to, e.g., bearing and drive mechanism tolerances. In normal operation, system 15 is adapted to be operated for scanning in the y-direction for set values of x.

Fixedly mounted off-stage (e.g., to a frame of the lithography tool) is an interferometer (or interferometer subsystem) that is generally indicated at 10. Interferometer 10 is configured to monitor the position of reflecting surface 51 along three measurement axes (e.g., $x_1$, $x_2$, and $x_3$) in each of two planes parallel to the x-axis, providing a measure of the position of stage 16 in the x-direction and the angular rotations of stage 16 about the y-and z-axes as stage 16 translates in the y-direction. Interferometer 10 includes two three-axis/plane interferometers such as interferometer 100 shown in FIG. 1a and arranged so that interferometric beams travel to and from mirror 50 generally along optical paths designated generally as path 12.

Also fixedly mounted off-stage (e.g., to the frame of the lithography tool) is an interferometer (or interferometer subsystem) that is generally indicated at 20. Interferometer 20 can be used to monitor the position of reflecting surface 61 along three measurement axes (e.g., $y_1$, $y_2$, and $y_3$) in each of two planes parallel to the y-axis, providing a measure of the position of stage 16 in the y-direction and the angular rotations of stage 16 about the x-and z-axes as stage 16 translates in the x-direction. Interferometer 20 includes two three-axis/plane interferometers such as interferometer 100 shown in FIG. 1a and arranged so that interferometric beams travel to and from mirror 60 generally along an optical path designated as 22.

In general, simultaneously sampled values for $x_1$, $x_2$, and $x_3$ for x-axis stage mirror 50 are acquired as a function of position of the mirror in the y-direction with the corresponding x-axis location and the stage mirror orientation nominally held at fixed values. In addition, values for $y_1$, $y_2$, and $y_3$ for y-axis stage mirror 60 are measured as a function of the position in the x-direction of the y-axis stage mirror with the corresponding y-axis location and stage orientation nominally held at fixed values. The orientation of the stage can be determined initially from information obtained using one or both of the three-axis/plane interferometers.

The SDP and the $SDP^e$ values for the x-axis stage mirror are calculated as a function of position of the x-axis stage mirror in the y-direction with the corresponding x-axis location and the stage mirror orientation nominally held at fixed values from the data acquired as discussed previously. Also the SDP and the $SDP^e$ values for the y-axis stage mirror are measured as a function of position in the x-direction of the y-axis stage mirror with the corresponding y-axis location and stage orientation nominally held at fixed values. Increased sensitivity to high spatial frequency components of the surface figure of a stage mirror can be obtained by measuring the respective SDP and the $SDP^e$ values with the stage oriented at large yaw angles and/or large measurement path lengths to the stage mirror, i.e., for large measurement beam shears at the respective measuring three-axis/plane interferometer.

The measurements of the respective SDP values for the x-axis and y-axis stage mirrors do not require monitoring of changes in stage orientation during the respective scanning of the stage mirrors other than to maintain the stage at a fixed nominal value since SDP is independent of stage mirror orientation except for third order effects. However, accurate monitoring of changes in stage orientation during scanning of a stage mirror may be required when a three-axis/plane interferometer is used to measure $SDP^e$s since these parameters may be sensitive to changes in stage orientation.

The surface figure error function for an x-axis stage mirror will, in general, be a, function of both y and z and the surface figure error function for the y-axis stage mirror will, in general, be a function of both x and z. The z dependence of surface figure error functions is suppressed in the remaining description of the data processing algorithms except where explicitly noted. The generalization to cover the z dependent properties can be addressed by using two three-axis/plane interferometer system in conjunction with a procedure to measure the angle between the x-axis and y-axis stage mirrors in two different parallel planes displaced along the z-direction corresponding to the two planes defined by the two three-axis/plane interferometer system.

The following description is given in terms of procedures used with respect to the x-axis stage mirror since the corresponding algorithms used with respect to the y-axis stage mirror can be easily obtained by a transformation of indices. Once the system has acquired values for $x_1(y)$, $x_2(y)$, and $x_3(y)$ for one or more locations of the stage with respect to the x-axis, values for SDP and on or mote $SDP^e$s are calculated from which $\xi(y)$ can be determined.

Turning now to mathematical expressions for the SDP and SDP, $SDP^e$ can be defined for a three-axis/plane interferometer such that it is not sensitive to either a displacement of a respective mirror or to the rotation of the mirror except through a third and/or higher order effect involving the angle of stage rotation in a plane defined by the three-axis/plane interferometer and departures of the stage mirror surface from a plane.

Different combinations of displacement measurements $x_1$, $x_2$, and $x_3$ may be used in the definition of a SDP. One definition of a SDP for an x-axis stage mirror is for example $$SDP(y) \equiv (x_2 - x_1) - \frac{b_2}{b_3 - b_2}(x_3 - x_2) \quad (4)$$

or $$SDP(y) = (x_2 - x_1) - \eta(x_3 - x_2) \quad (5)$$

where $$\eta \equiv \frac{b_2}{b_3 - b_2}. \quad (6)$$

Note that SDP can be written in terms of single pass displacements using Equation (3), i.e., $$SDP(y) = \frac{1}{2}[(x'_2 - x'_1) - \eta(x'_3 - x'_2)]. \quad (7)$$

Of course, corresponding equations apply for a y-axis stage mirror.

The lowest order term in a series representation of the SDP is related to the second spatial derivative of a functional representation of the surface figure (e.g., corresponding to the second order term of a Taylor series representation of a surface figure error function). Accordingly, for relatively large spatial wavelengths, the SDP is substantially equal to the second derivative of the mirror surface figure. Generally, the SDP is determined for a line intersecting a mirror in a plane determined by the orientation of an interferometry assembly with respect to the stage mirror.

Certain properties of the three-axis/plane interferometer relevant to measurement of values of SDP are apparent. For example, SDP is independent of a displacement of the mirror for which SDP is being measured. Furthermore, SDP is generally independent of a rotation of the mirror for which SDP is being measured except through a third order or higher effects. SDP should be independent of properties of the primary single pass measurement beam path $x'_0$ in the three-axis/plane interferometer. SDP should be independent of properties of the retroreflector in the three-axis/plane interferometer. Furthermore, SDP should be independent of changes in the average temperature of the three-axis/plane interferometer and should be independent of linear temperature gradients in the three-axis/plane interferometer. SDP should be independent of linear spatial gradients in the refractive indices of certain components in a three-axis/plane interferometer. SDP should be independent of linear spatial gradients in the refractive indices and/or thickness of cements between components in a three-axis/plane interferometer. SDP should also be independent of "prism effects" introduced in the manufacture of components of a three-axis/plane interferometer used to measure the SDP.

$SDP^e$s are designed to exhibit spatial filtering properties of the surface figure error function $\xi$ that are similar to the spatial filtering properties of the surface figure error function $\xi$ by SDP for a given portion of the respective stage mirror. $SDP^e$s can also be defined that exhibit invariance properties similar to those of SDP in procedures for determining the surface figure error function $\xi$. As a consequence of the invariance properties, neither knowledge of either the orientation of the stage mirror nor accurate knowledge of position of the stage mirror is required, e.g., accurate knowledge is not required of the position in the direction of the displacement measurements used to compute the $SDP^e$s. However, changes in the orientation of the stage mirror are monitored during the acquisition of linear displacement measurements used to determine $SDP^e$s.

$SDP^e$s can be defined such that the properties of the transfer functions with respect to the surface figure error function $\xi$ is similar to the properties of the transfer function of SDP with respect to the surface figure error function $\xi$. The properties of $SDP^e$s with respect to terms of linear first pass displacement measurements is developed from knowledge of the properties of the SDP with respect to terms of linear first pass displacement measurements for a surface error function $\xi$ that is periodic with a fundamental periodicity length L and for domains in y that are exclusive of the domain in y for which the corresponding SDP is valid. Two $SDP^e$s, denoted as $SDP_1^e$ and $SDP_2^e$, for a domain given by $$L = q2b_3, \; q=2,3,\ldots, \quad (8)$$

are given by the formulae $$SDP_1^e(y, \vartheta_z) \equiv \frac{1}{2}\left\{\begin{array}{l}[x'_2(y) - x'_1(y)] + \\ \eta[x'_2(y) - x'_1(y - L + 2b_3)]\end{array}\right\} - \quad (9)$$

$$x\vartheta_z \frac{\partial}{\partial y}[SDP_1^e(y, \vartheta_z = 0)],$$

$$\frac{1}{2} - \frac{2(b_3 - b_2)}{L} \leq \frac{y}{L} \leq \frac{1}{2},$$

$$SDP_2^e(y, \vartheta_z) \equiv -\frac{1}{2}\{[x'_3(y + L - 2b_3) - x'_2(y)] + \eta[x'_3(y) - x'_2(y)]\} - \quad (10)$$

$$x\vartheta_z \frac{\partial}{\partial y}[SDP_2^e(y, \vartheta_z = 0)], -$$

$$\frac{1}{2} \leq \frac{y}{L} \leq -\frac{1}{2} + \frac{2b_2}{L}.$$

where the last term in Equations (9) and (10) is a third order term with an origin in a second order geometric term such as described in commonly owned U.S. patent application Ser. No. 10/347,271 entitled "COMPENSATION FOR GEOMETRIC EFFECTS OF BEAM MISALIGNMENTS IN PLANE MIRROR INTERFEROMETERS" and U.S. patent application Ser. No. 10/872,304 entitled "COMPENSATION FOR GEOMETRIC EFFECTS OF BEAM MISALIGNMENTS IN PLANE MIRROR INTERFEROMETER METROLOGY SYSTEMS," both of which are by Henry A. Hill and both of which are incorporated herein in their entirety by reference.

Expressing $SDP_1^e$ and $SDP_2^e$ in terms of pairs of single pass displacement measurements obtained at time $t_j$, j=1, 2, ..., the following equations are derived from Equations (9) and (10):

$$SDP_1^e(y, \vartheta_z) \equiv \frac{1}{2}\left[(1+\eta)[x'_2(y, t_1) - x'_1(y, t_1)] + \right. \quad (11)$$

$$\eta \left\{\begin{array}{l}[x'_3(y - 2b_3, t_2) - x'_1(y - 2b_3, t_2)] \\ +[x'_3(y - 2\times 2b_3, t_3) - x'_1(y - 2\times 2b_3, t_3)] \\ \vdots \\ +[x'_3(y - (q-1)2b_3, t_q) - x'_1(y - (q-1)2b_3, t_q)]\end{array}\right\} - $$

$$x\vartheta_z \frac{\partial}{\partial y}[SDP_1^e(y, \vartheta_z = 0)], \frac{1}{2} - \frac{2(b_3 - b_2)}{L} \leq \frac{y}{L} \leq \frac{1}{2},$$

-continued $$SDP_2^e(y, \vartheta_z) = -\frac{1}{2}\left\{(1+\eta)[x_3'(y, t_1) - x_2'(y, t_1)] + \right.$$

$$\left.\begin{cases} +[x_3'(y+L-2b_3, t_2) - x_1'(y+L-2b_3, t_2)] \\ +[x_3'(y+L-2\times 2b_3, t_3) - x_1'(y+L-2\times 2b_3, t_3)] \\ \vdots \\ +[x_3'(y+L-(q-1)2b_3, t_q) - x_1'(y+L-(q-1)2b_3, t_q)] \end{cases}\right\} - \quad (12)$$

$$x\vartheta_z \frac{\partial}{\partial y}[SDP_2^e(y, \vartheta_z = 0)],$$

$$-\frac{1}{2} \leq \frac{y}{L} \leq -\frac{1}{2} + \frac{2b_2}{L}, \text{ where } t_i \neq t_j, i \neq j.$$

Figure 2B:
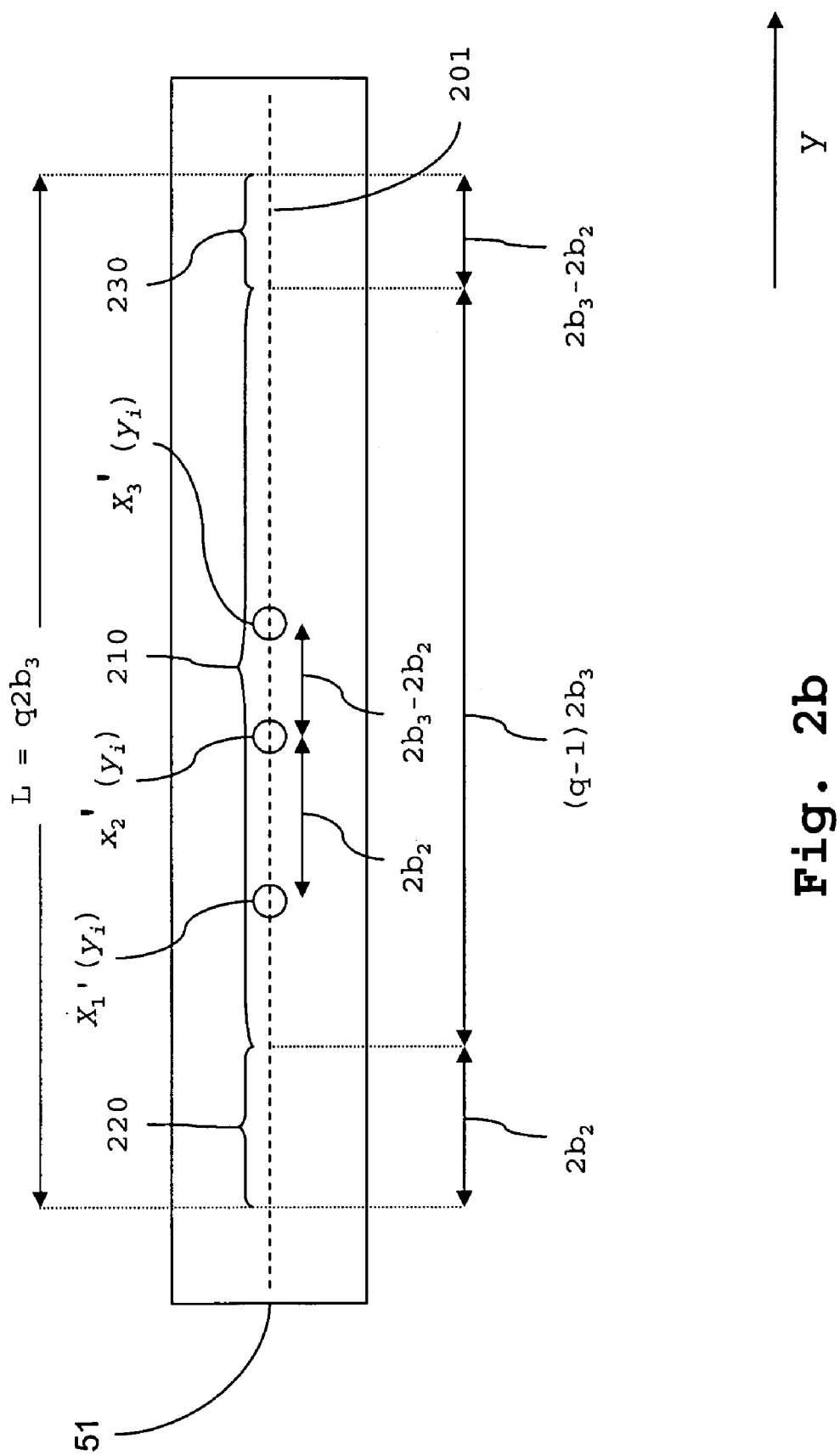
FIG. 2b is a diagram showing domains for a second difference parameter (SDP) and extended SDP-related parameters on a surface of a mirror.

FIG. 2b illustrate the relationship of the domains for which SDP, $SDP_1^e$, and $SDP_2^e$ are defined on mirror surface 51. Domain L corresponds to a portion of mirror surface 51 along a scan line 201 in the y-direction. The locations of the first pass beams on mirror surface 51 are shown for the mirror at position $y_i$. Note that the domains in y for SDP, $SDP_1^e$, and $SDP_2^e$, i.e., $$-\frac{1}{2} + \left(\frac{2b_2}{L}\right) \leq \frac{y}{L} \leq \frac{1}{2} - \left(\frac{2b_3 - 2b_2}{L}\right), \frac{1}{2} - \frac{(2b_3 - 2b_2)}{L} \leq \frac{y}{L} \leq \frac{1}{2},$$

and $$-\frac{1}{2} \leq \frac{y}{L} \leq -\frac{1}{2} + \frac{2b_2}{L},$$

are mutually exclusive and that the combined domains in y of the three domains cover the domain $$-\frac{1}{2} \leq \frac{y}{L} \leq \frac{1}{2}.$$

For a section of the x-axis stage mirror covering domain L in y, the surface figure error function $\xi(y)$ can be expressed by the Fourier series $$\xi(y) = \sum_{m=0}^{N} A_m \cos\left(m2\pi \frac{y}{L}\right) + \sum_{m=0}^{N} B_m \sin\left(m2\pi \frac{y}{L}\right), -\frac{1}{2} \leq \frac{y}{L} \leq \frac{1}{2}, \quad (13)$$

where N is an integer determined by consideration of the spatial frequencies that are to be included in the series representation. The term represented by $A_0$ which is sometimes referred to as a "piston" type error is included in Equation (13) for completeness. An error of this type is equivalent to the effect of a displacement of the stage mirror in the direction orthogonal to the stage mirror surface and as such is not considered an intrinsic property of the surface figure error function. Using the definition of SDP given by Equation (7), the corresponding series for SDP is next written as $$SDP(x, y, \vartheta_z) = \frac{1}{2}\sum_{m=1}^{N} \cos\left(m2\pi \frac{y}{L}\right) \times \quad (14)$$

$$\left\{\begin{aligned} &A_m\left[(1+\eta) - \cos\left(m2\pi \frac{2b_2}{L}\right) - \right.\\ &\left.\eta \cos\left(m2\pi \frac{2b_3 - 2b_2}{L}\right)\right] + \\ &B_m\left[\sin\left(m2\pi \frac{2b_2}{L}\right) - \eta\sin\left(m2\pi \frac{2b_3 - 2b_2}{L}\right)\right]\end{aligned}\right\} +$$

$$\frac{1}{2}\sum_{m=1}^{N} \sin\left(m2\pi \frac{y}{L}\right) \times$$

$$\left\{\begin{aligned} &-A_m\left[\sin\left(m2\pi \frac{2b_2}{L}\right) - \eta\sin\left(m2\pi \frac{2b_3 - 2b_2}{L}\right)\right] + \\ &B_m\left[(1+\eta) - \cos\left(m2\pi \frac{2b_2}{L}\right) - \right.\\ &\left.\eta\cos\left(m2\pi \frac{2b_3 - 2b_2}{L}\right)\right]\end{aligned}\right\} -$$

$$x\vartheta_z \frac{\partial}{\partial y}[SDP(y, \vartheta_z = 0)],$$

$$-\frac{1}{2}\left(1 - \frac{2b_2}{L}\right) \leq \frac{y}{L} \leq \frac{1}{2}\left[1 - \left(\frac{2b_3 - 2b_2}{L}\right)\right],$$

where x is a linear displacement of the stage mirror based on one or more of the linear displacements $x_i$, i=1,2, and/or 3, and $\theta_z$ is the angular orientation of the stage mirror in the x-y plane. The last term in Equation (14) is a third order term with an origin in a second order geometric term such as described in commonly owned U.S. patent application Ser. No. 10/347,271 entitled "COMPENSATION FOR GEOMETRIC EFFECTS OF BEAM MISALIGNMENTS IN PLANE MIRROR INTERFEROMETERS" and U.S. patent application Ser. No. 10/872,304 entitled "COMPENSATION FOR GEOMETRIC EFFECTS OF BEAM MISALIGNMENTS IN PLANE MIRROR INTERFEROMETER METROLOGY SYSTEMS," both of which are by Henry A. Hill and both of which are incorporated herein in their entirety by reference.

The presence of the third order term in Equation (14) makes it possible to measure the high spatial frequency components of $\xi(y)$ in the x-y plane with increased sensitivity compared to the sensitivity represented by the first order, i.e., remaining, terms in Equation (14). The third order term also makes it possible to obtain information about intermediate and low spatial frequency components of $\xi$ in the x-z plane complimentary to that obtained by the first order terms in Equation (14).

Note in Equation (14) that the constant term $A_0$ is not present. This property is subsequently used in a procedure for elimination of effects of the offset errors and changes in stage orientation. The loss of information about the constant term $A_0$ is not relevant to the determination of the intrinsic portion of the surface figure error function, since as noted above, $A_0$ corresponds to a displacement of the stage mirror in the direction orthogonal to the surface of the stage mirror.

Equation (14) may be rewritten in terms of $\eta$ and $b_3$ and eliminating $b_2$ by using Equation (6) with the result $$SDP(x, y, \vartheta_z) = \frac{1}{2}\sum_{m=1}^{N} \cos\left(m2\pi\frac{y}{L}\right) \times \quad (15)$$

$$\left\{ \begin{array}{l} A_m\left[(1+\eta) - \cos\left(m2\pi\frac{\eta}{1+\eta}\frac{2b_3}{L}\right) - \right. \\ \left. \eta\cos\left(m2\pi\frac{1}{1+\eta}\frac{2b_3}{L}\right)\right] + \\ B_m\left[\sin\left(m2\pi\frac{\eta}{1+\eta}\frac{2b_3}{L}\right) - \right. \\ \left. \eta\sin\left(m2\pi\frac{1}{1+\eta}\frac{2b_3}{L}\right)\right] \end{array} \right\} +$$

$$\frac{1}{2}\sum_{m=1}^{N} \sin\left(m2\pi\frac{y}{L}\right) \times$$

$$\left\{ \begin{array}{l} -A_m\left[\sin\left(m2\pi\frac{\eta}{1+\eta}\frac{2b_3}{L}\right) - \right. \\ \left. \eta\sin\left(m2\pi\frac{1}{1+\eta}\frac{2b_3}{L}\right)\right] + \\ B_m\left[(1+\eta) - \cos\left(m2\pi\frac{\eta}{1+\eta}\frac{2b_3}{L}\right) - \right. \\ \left. \eta\cos\left(m2\pi\frac{1}{1+\eta}\frac{2b_3}{L}\right)\right] \end{array} \right\} -$$

$$x\vartheta_z \frac{\partial}{\partial y}[SDP(y, \vartheta_z = 0)],$$

$$-\frac{1}{2}\left[1 - \left(\frac{\eta}{1+\eta}\right)\frac{2b_3}{L}\right] \leq \frac{y}{L} \leq \frac{1}{2}\left[1 - \left(\frac{1}{1+\eta}\right)\frac{2b_3}{L}\right].$$

A contracted form of Equation (15) is obtained with the introduction of a complex transfer function T(m) having real and imaginary amplitudes of $T_{Re}$ and $T_{Im}$, respectively, as $$SDP(x, y, \vartheta_z) = \frac{1}{2}\sum_{m=1}^{N}\left[\cos\left(m2\pi\frac{y}{L}\right)A'_m + \sin\left(m2\pi\frac{y}{L}\right)B'_m\right] - \quad (16)$$

$$x\vartheta_z \frac{\partial}{\partial y}[SDP(y, \vartheta_z = 0)],$$

$$-\frac{1}{2}\left[1 - \left(\frac{\eta}{1+\eta}\right)\left(\frac{2b_3}{L}\right)\right] \leq \frac{y}{L} \leq \frac{1}{2}\left[1 - \left(\frac{1}{1+\eta}\right)\left(\frac{2b_3}{L}\right)\right]$$

where $$A'_m = A_m T_{Re} + B_m T_{Im} \quad (17)$$

and $$B'_m = -A_m T_{Im} + B_m T_{Re}. \quad (18)$$

with $$T_{Re} = \left[(1+\eta) - \cos\left(m2\pi\frac{\eta}{1+\eta}\frac{2b_3}{L}\right) - \eta\cos\left(m2\pi\frac{1}{1+\eta}\frac{2b_3}{L}\right)\right], \quad (19)$$

and $$T_{Im} = \left[\sin\left(m2\pi\frac{\eta}{1+\eta}\frac{2b_3}{L}\right) - \eta\sin\left(m2\pi\frac{1}{1+\eta}\frac{2b_3}{L}\right)\right]. \quad (20)$$

The transfer function, T(m), relates the Fourier coefficients $A'_m$ and $B'_m$ of the SDP to the Fourier coefficients of $\xi(y)$, $A_m$ and $B_m$. As is evident from Equations (19) and (20), T(m) depends on $\eta$ and $b_3/L$ in addition to depending on spatial frequency (as indicated by dependence on m). The dependence on spatial frequency manifests as a varying sensitivity of the transfer function to spatial frequency, with zero sensitivity occurring at certain spatial frequencies. Lack of sensitivity at a spatial frequency means that the SDP parameter does not contain any information of the mirror surface for that frequency. Subsequent calculation of the function $\xi(y)$ should make note of these low sensitivity frequencies and handle them appropriately.

Figure 3:
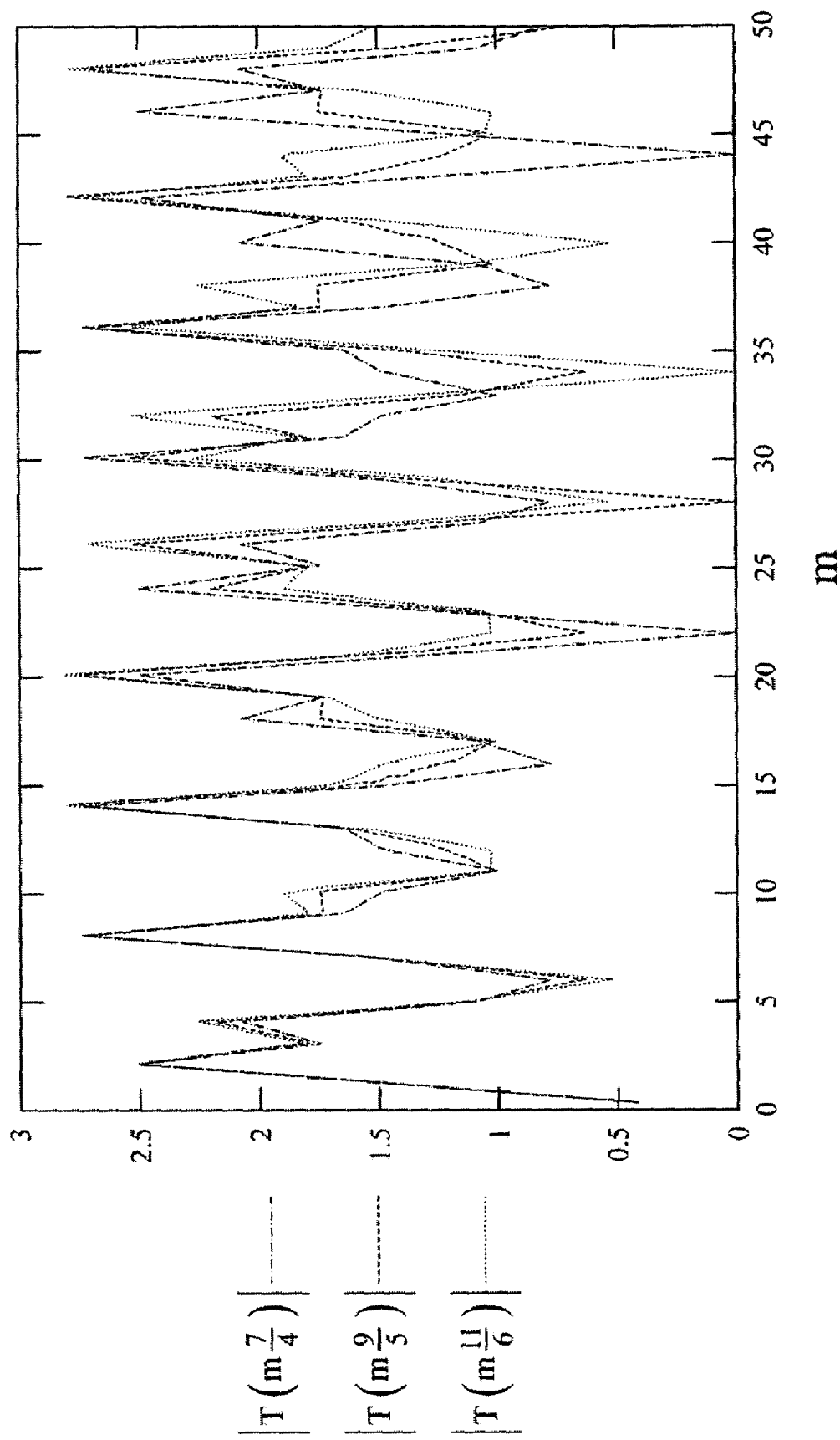
FIG. 3 is a plot comparing the transfer function magnitude as a function of spatial frequency for different values of $\eta$.

As an example, the magnitude $|T(m)|$ of T(m) is plotted in FIG. 3 as a function of m for $L=4b_3$ and $2b_3=50$ mm and for $\eta=7/4$, 9/5, and 11/6. The first zero in $|T(m)|$ for $m \geq 1$, corresponding to zero sensitivity of the transfer function, occurs at m=22, 28, and 34 for $\eta=7/4$, 9/5, and 11/6, respectively. The spatial wavelength $\Lambda_1=4.55$, 3.57, and 2.94 mm for m=22, 28, and 34, respectively. The value of $\eta$ is selected based on consideration of the corresponding spatial wavelength $\Lambda_1$, whether or not the displacements $x_i$ are to be not sensitivity to spatial wavelength $\Lambda_1$ corresponding to the first zero of $|T(m)|$, and the diameter of the measurement beams.

There are values of $\eta$ such as $\eta=7/4$, 9/5, and 11/6 belong to one set of $\eta$'s that lead to a property of measured values of $x_i$ wherein the $x_i$ are obtained using a corresponding three-axis/plane interferometer. The first set of $\eta$'s can be expressed as a ratio of two integers that can not be reduced to a ratio of smaller integers and the numerator is an odd integer. The second set of $\eta$'s are a subset of the first set of $\eta$'s wherein the denominator of the ratio is an even integer. An $\eta$ of the first set of $\eta$'s is defined, for example, by the ratio $$\eta = \frac{2n-1}{n}, n = 2, 3, \ldots. \quad (21)$$

An $\eta$ of the corresponding second set of $\eta$'s is a subset of the first set of $\eta$'s defined by Equation (21) for even values of $\eta$.

A property associated with this first set of $\eta$'s is that the effects of the spatial frequencies corresponding the first zero of $|T(m)|$ for m>0, i.e., corresponding to the spatial frequency that is not measured, cancel out in the linear displacements $x_1$ and $x_2$.

A property associated with the second set of $\eta$'s is that the effects of the spatial frequencies corresponding the first zero of $|T(m)|$ for m>0 cancel out in each of the linear displacements $x_1$, $x_2$, and $x_3$.

The first zero in $|T(m)|$ for $m \geq 1$ and for the first set of $\eta$'s is given by twice the sum of the numerator and denominator of the ratio defining an T. For the $\eta$'s defined by Equation (21), the corresponding values of m for the first zero in $|T(m)|$ for m>0 is given by the formula $$m=2(3n-1). \quad (22)$$

The spatial wavelength $\Lambda_1$ corresponding to the first zero in $|T(m)|$ for $m \geq 1$ is equal to $2b_3$ divided by the sum of the numerator and denominator of the ratio defining an $\eta$. For the $\eta$'s defined by Equation (21), the corresponding values of $\Lambda_1$ are $$\Lambda_1 = \frac{2b_3}{3n-1}. \quad (23)$$

The effects of the corresponding spatial frequency cancel out in $x_1$ and $x_2$ for $\eta$'s of the first set of $\eta$'s because the spacing $b_2$ between the primary first pass measurement beam and the second pass measurement beams of measurement axes $x_1$ and $x_2$ are an odd harmonic of $\Lambda_1/2$, i.e., $$b_2 = (2n-1)\frac{\Lambda_1}{2}. \quad (24)$$

The effects of the corresponding spatial frequency cancel out in $x_1$, $x_2$, and $x_3$ for $\eta$'s of the second set of $\eta$'s because the spacing $b_2$ between the primary first pass measurement beam and the second pass measurement beams of measurement axes $x_1$ and $x_2$ and the spacing $(2b_3-b_2)$ between the primary first pass measurement beam and the second pass measurement beam of measurement axis $x_3$ are each an odd harmonic of $\Lambda_1/2$, i.e., spacing $b_2$ is given by Equation (24) and spacing $(2b_3-b_2)$ is given by the equation $$(2b_3 - b_2) = (4n-1)\frac{\Lambda_1}{2}. \quad (25)$$

There are other values of $\eta$'s that belong to the first set which are given by the formulae $$\eta = \frac{2n+1}{n}, n=2,3,... \quad (26)$$

The corresponding values for $\Lambda_1$, $b_2$, and $(2b_3-b_2)$ are $$\Lambda_1 = \frac{2b_3}{3n-1}, \quad (27)$$

$$b_2 = (2n+1)\frac{\Lambda_1}{2}, \quad (28)$$

$$(2b_3 - b_2) = (4n+1)\frac{\Lambda_1}{2}. \quad (29)$$

Other values of $\eta$'s that belong to the second set are given by the formulae $$\eta = \frac{2n \pm 1}{2n}, n=2,3,.... \quad (30)$$

The corresponding values for $\Lambda_1$, $b_2$, and $(2b_3-b_2)$ are $$\Lambda_1 = \frac{2b_3}{4n \pm 1}, \quad (31)$$

$$b_2 = (2n \pm 1)\frac{\Lambda_1}{2}, \quad (32)$$

$$(2b_3 - b_2) = (6n \pm 1)\frac{\Lambda_1}{2}. \quad (33)$$

The cut off spatial frequency in the determination of the surface figure properties represented by $\xi$ when using the three-axis/plane interferometer will be determined by the spatial filtering properties of measurement beams having a finite diameter, i.e., the finite size of a measurement beam will serve as a low pass filter with respect to effects of the higher frequency spatial frequencies of $\xi$. These effects are evaluated here for a measurement beam with a Gaussian profile. For a Gaussian profile with a $1/e^2$ diameter of $2s$ with respect to beam intensity, the effect of the spatial filtering of a Fourier series component with a spatial wavelength $\Lambda$ is given by a transfer function $T_{Beam}$ where $$T_{Beam} = e^{-\left(\frac{\pi^2}{8}\right)\left(\frac{2s}{\Lambda}\right)^2}. \quad (34)$$

Consider for example the effect of a Gaussian beam profile with a $1/e^2$ diameter of $2s=5.0$ mm. The attenuation effect of the spatial filtering will be 0.225, 0.089, and 0.028 for $\Lambda=4.55$, 3.57, and 2.94 mm, respectively, for the respective Fourier series component amplitudes.

The series representations of $SDP_1^e$ and $SDP_2^e$ for the Fourier series representation of $\xi(y)$ given by Equation (13) are $$SDP_1^e(x, y, \vartheta_z) = \frac{1}{2}\sum_{m=1}^{N}\left[\cos\left(m2\pi\frac{y}{L}\right)A'_m + \sin\left(m2\pi\frac{y}{L}\right)B'_m\right] + \quad (35)$$

$$\eta\frac{L}{2}\vartheta_z - x\vartheta_z \frac{\partial}{\partial y}[SDP_1^e(y, \vartheta_z = 0)],$$

$$\frac{1}{2}\left[1 - 2\left(\frac{1}{1+\eta}\right)\left(\frac{2b_3}{L}\right)\right] \leq \frac{y}{L} \leq \frac{1}{2},$$

$$SDP_2^e(x, y, \vartheta_z) = \frac{1}{2}\sum_{m=1}^{N}\left[\cos\left(m2\pi\frac{y}{L}\right)A'_m + \sin\left(m2\pi\frac{y}{L}\right)B'_m\right] - \quad (36)$$

$$\frac{L}{2}\vartheta_z - x\vartheta_z \frac{\partial}{\partial y}[SDP_2^e(y, \vartheta_z = 0)],$$

$$-\frac{1}{2} \leq \frac{y}{L} \leq -\frac{1}{2}\left[1 - 2\left(\frac{\eta}{1+\eta}\right)\left(\frac{2b_3}{L}\right)\right].$$

Note in Equations (35) and (36) that the constant term $A_0$ is not present. The discussion of this feature relevant to the intrinsic surface figure error function is the same as the corresponding portion of the discussion related to the constant term $A_0$ not being included in Equation (14).

From a comparison of Equations (35) and (36), another property of $SDP_1^e$ and $SDP_2^e$ is evident, i.e., the respective contributions of the Fourier series terms in $A'_m$ and $B'_m$ are the same in $SDP_1^e$ and $SDP_2^e$. Furthermore, the respective contributions of the Fourier series terms in $A'_m$ and $B'_m$ in $SDP^{1e}$ and $SDP_2^e$ are the same as the respective contributions in SDP (see Equation (16)).

The $SDP_1^e$ and $SDP_2^e$ are classified as conjugate other SDP related parameters because of the cited property and because the first order terms $\theta L\theta_z$ and $-L\eta_z$, respectively, multiplied by the respective domains in y, i.e., $b_3/(1+\eta)$ and $\eta b_3/(1+\eta)$, respectively, are equal in magnitude and have opposite signs.

While certain $SDP^e$s have been explicitly defined, there are also other $SDP^e$s for $L=4b_3+q2b_2+p2(b_3-b_2)$, $q=1, 2,..., p=1, 2,...$, that exhibit similar properties as those of identified with respect to $SDP_1^e$ and $SDP_2^e$, such as an invariance to displacements of the stage mirror as evident on inspection of Equations (11) and (12). Another property of $SDP_1^e$ and $SDP_2^e$ is that the effect of a stage rotation and the corresponding changes in $SDP_1^e$ and $SDP_2^e$ multiplied by their respective domain widths in y are equal in magnitude but opposite in signs. This property is evident on examination of Equations (35) and (36).

In some embodiments, the effects of the offset errors and the effects of changes in q, that occur during the measurements of $x_1(y)$, $x_2(y)$, and $x_3(y)$ are next included in the representations of SDP, $SDP_1^e$, and $SDP_2^e$. The offset errors for $x_1$, $x_2$, and $x_3$ are represented by $E_1$, $E_2$, and $E_3$, respectively. Offset errors arise in SDP because SDP is derived from three different interferometer measurements where each of the three interferometers can only measure relative changes in a respective reference and measurement beam paths. In addition, the offset errors may change with time because the calibrations of each of the three interferometers may change with respect to each other, e.g. due to changes in temperature. The effects of changes in the orientation of the stage during the measurements of SDP, $SDP_1^e$, and $SDP_2^e$ are accommodated by representing the orientation of the stage $\theta_z$ as $\theta_z(y)$.

The representations of SDP, $SDP_1^e$, and $SDP_2^e$ that include the effects of offset errors and changes in stage orientation are accordingly expressed as $$SDP(x, y, \vartheta_z) = \frac{1}{2}\sum_{m=1}^{N}\left[\cos\left(m2\pi\frac{y}{L}\right)A'_m + \sin\left(m2\pi\frac{y}{L}\right)B'_m\right] - \quad (37)$$

$$x\overline{\vartheta}_z\frac{\partial}{\partial y}[SDP(y, \vartheta_z = 0)] - [E_1 - (1+\eta)E_2 + \eta E_3],$$

$$-\frac{1}{2}\left[1 - 2\left(\frac{\eta}{1+\eta}\right)\left(\frac{2b_3}{L}\right)\right] \le \frac{y}{L} \le \frac{1}{2}\left[1 - 2\left(\frac{1}{1+\eta}\right)\left(\frac{2b_3}{L}\right)\right];$$

$$SDP_1^e(x, y, \vartheta_z) = \frac{1}{2}\sum_{m=1}^{N}\left[\cos\left(m2\pi\frac{y}{L}\right)A'_m + \sin\left(m2\pi\frac{y}{L}\right)B'_m\right] - \quad (38)$$

$$x\overline{\vartheta}_z\frac{\partial}{\partial y}[SDP_1^e(y, \vartheta_z = 0)] - (1+\eta q)E_1 +$$

$$(1+\eta)E_2 + \eta(q-1)E_3 +$$

$$\eta b_3 \left\{ \begin{array}{c} \vartheta_z(y) + \vartheta_z(y - 2b_3) + \ldots + \\ \vartheta_z[y - 2(q-1)b_3] \end{array} \right\},$$

$$\frac{1}{2}\left[1 - 2\left(\frac{1}{1+\eta}\right)\left(\frac{2b_3}{L}\right)\right] \le \frac{y}{L} \le \frac{1}{2}; \text{ and}$$

$$SDP_2^e(x, y, \vartheta_z) = \frac{1}{2}\sum_{m=1}^{N}\left[\cos\left(m2\pi\frac{y}{L}\right)A'_m + \sin\left(m2\pi\frac{y}{L}\right)B'_m\right] - \quad (39)$$

$$x\overline{\vartheta}_z\frac{\partial}{\partial y}[SDP_2^e(y, \vartheta_z = 0)] + (q-1)E_1 +$$

$$(1+\eta)E_2 - (q+\eta)E_3 +$$

$$b_3 \left\{ \begin{array}{c} \vartheta_z(y) + \vartheta_z(y + L - 2b_3) + \\ \vartheta_z(y + L - 4b_3) + \ldots + \\ \vartheta_z[y + L - 2(q-1)b_3] \end{array} \right\},$$

$$-\frac{1}{2} \le \frac{y}{L} \le -\frac{1}{2}\left[1 - 2\left(\frac{\eta}{1+\eta}\right)\left(\frac{2b_3}{L}\right)\right]$$

where fourth order of effects arising from the y dependence of $\theta_z(y)$ have been neglected in Equations (37), (38), and (39) and $\overline{\theta}_z$ represents the average value of $\theta_z(y)$ over the domain in y.

The lower and upper limits $y_1$ and $y_2$, respectively, of the domains in y for $SDP_1^e$, and $SDP_2^e$, respectively, are $$y_1 = y_0 + \frac{L}{2} - 2(b_3 - b_2), \quad (40)$$

$$y_2 = y_0 - \frac{L}{2} + 2b_2 \quad (41)$$

where $y^0$ corresponds to the value of y at the middle of the domain in y. At the lower and upper limits $y_1$ and $y_2$, the respective $SDP_1^e$ and $SDP_2^e$ are expressed as $$SDP_1^e(x, y_1, \vartheta_z) = \frac{1}{2}\sum_{m=1}^{N}\left[\cos\left(m2\pi\frac{y_1}{L}\right)A'_m + \sin\left(m2\pi\frac{y_1}{L}\right)B'_m\right] - \quad (42)$$

$$x\overline{\vartheta}_z\frac{\partial}{\partial y}[SDP_1^e(y_1, \vartheta_z = 0)] - (1+\eta q)E_1 +$$

$$(1+\eta)E_2 + \eta(q-1)E_3 +$$

$$\eta b_3 \left\{ \begin{array}{c} \vartheta_z\left[y_0 + \frac{L}{2} - 2(b_3 - b_2)\right] + \\ \vartheta_z\left[y_0 + \frac{L}{2} - 2(b_3 - b_2) - 2b_3\right] + \ldots + \\ \vartheta_z\left[y_0 + \frac{L}{2} - 2(b_3 - b_2) - 2(q-1)b_3\right] \end{array} \right\},$$

$$SDP_2^e(x, y_2, \vartheta_z) = \frac{1}{2}\sum_{m=1}^{N}\left[\cos\left(m2\pi\frac{y_2}{L}\right)A'_m + \sin\left(m2\pi\frac{y_2}{L}\right)B'_m\right] - \quad (43)$$

$$x\overline{\vartheta}_z\frac{\partial}{\partial y}[SDP_2^e(y_2, \vartheta_z = 0)] + (q-1)E_1 +$$

$$(1+\eta)E_2 - (q+\eta)E_3 +$$

$$b_3 \left\{ \begin{array}{c} \vartheta_z\left[y_0 - \frac{L}{2} + 2b_2\right] + \\ \vartheta_z\left[y_0 + \frac{L}{2} + 2b_2 - 2b_3\right] + \\ \vartheta_z\left[y_0 + \frac{L}{2} + 2b_2 - 4b_3\right] + \ldots + \\ \vartheta_z\left[y_0 + \frac{L}{2} + 2b_2 - 2(q-1)b_3\right] \end{array} \right\}.$$

It is evident on examination of Equations (37), (42), and (43) that the contribution of the surface figure error function terms to SDP and $SDP_1^e$ are continuous at $y_1$ and that the contribution of the surface figure error function terms to SDP and $SDP_2^e$ are continuous at $y_2$. This is a very significant property which is subsequently used in a procedure to eliminate the effects of offset errors $E_1$, $E_2$, and $E_3$ and the effects of the y dependence of $\theta_z(y)$.

As a consequence of the property, the differences between SDP and $SDP_1^e$ at $y_1$ and between SDP and $SDP_2^e$ at $y_2$ are independent of the surface figure error function except for the values of the surface figure error at the extreme edges of the domain being mapped. Expressions for the differences are obtained using Equations (37), (42), and (43) with the results $$[SDP_1^e(x, y_1, \vartheta_z) - SDP(y_1)] = -\eta q(E_1 - E_3) + \quad (44)$$

$$\left(\frac{\xi\left(y_0 + \frac{L}{2}\right) - \xi\left(y_0 - \frac{L}{2}\right)}{2}\right) +$$

-continued $$\eta b_3 \begin{Bmatrix} \vartheta_z\left(y_0 + \frac{L}{2} + 2b_2 - 2b_3\right) + \\ \vartheta_z\left(y_0 + \frac{L}{2} + 2b_2 - 4b_3\right) + \ldots + \\ \vartheta_z\left(y_0 + \frac{L}{2} + 2b_2 - 2qb_3\right) \end{Bmatrix},$$

$$[SDP(y_2) - SDP_2^e(x, y_2, \vartheta_z)] = -q(E_1 - E_3) + \qquad (45)$$

$$\left(\frac{\xi_3\left(y_0 + \frac{L}{2}\right) - \xi_1\left(y_0 - \frac{L}{2}\right)}{2}\right) +$$

$$b_3 \begin{Bmatrix} \vartheta_z\left(y_0 - \frac{L}{2} + 2b_2\right) + \\ \vartheta_z\left(y_0 + \frac{L}{2} + 2b_2 - 2b_3\right) + \\ \vartheta_z\left(y_0 + \frac{L}{2} + 2b_2 - 4b_3\right) + \ldots + \\ \vartheta_z\left[y_0 + \frac{L}{2} + 2b_2 - 2(q-1)b_3\right] \end{Bmatrix}.$$

Using the relationship $L=2qb_3$ given by Equation (8), Equation (45) is written as $$[SDP(y_2) - SDP_2^e(x, y_2, \vartheta_z)] = -q(E_1 - E_3) + \qquad (46)$$

$$\left(\frac{\xi\left(y_0 + \frac{L}{2}\right) - \xi_1\left(y_0 - \frac{L}{2}\right)}{2}\right) +$$

$$b_3 \begin{Bmatrix} \vartheta_z\left(y_0 + \frac{L}{2} + 2b_2 - 2b_3\right) + \\ \vartheta_z\left(y_0 + \frac{L}{2} + 2b_2 - 4b_3\right) + \ldots + \\ \vartheta_z\left[y_0 + \frac{L}{2} + 2b_2 - 2qb_3\right] \end{Bmatrix}.$$

The ratio of the value of the discontinuity $D_1(y_0)$ given Equation (44) and the value of the discontinuity $D_2(y_0)$ given by Equation (46) is thus equal to $\eta$, i.e.

$$D_1(y_0) = \eta D_2(y_0) \qquad (47)$$

where $$D_1(y_0) \equiv [SDP_1^e(x, y_1, \theta_z) - SDP(y_1, \theta_z)], \qquad (48)$$

$$D_2(y_0) \equiv [SDP(y_2, \theta_z) - SDP_2^e(x, y_2, \theta_z)]. \qquad (49)$$

Based on the foregoing mathematical development, a general procedure for determining a surface figure error function, $\xi(y)$, without any prior knowledge of the surface figure is as follows. First, select the length of the mirror that is to be mapped by selecting a value of q. The length of the mirror is given by Equation (8). Orient the stage mirror so that $\theta_z$ is at or about zero and the distance x from the interferometer to the stage mirror being mapped is relatively small. The small distance can reduce the contribution to the geometric error correction term. While maintaining a nominal x distance to the stage mirror, acquire simultaneous values for $x_1$, $x_2$, and $x_3$ while scanning the mirror in the y-direction and monitor the position of the mirror in the y-direction and changes in stage orientation during the scan. The $x_1$, $x_2$, and $x_3$ values, the position of the mirror in the y-direction, and the changes in stage orientation can be stored to the electronic controller's memory or to disk. The stored data will be in the form of a 3×N array for the $x_1$, $x_2$, and $x_3$ information, where N is the total number of samples across the mirror, a 1×N array for y position information and a 1×N array for changes in stage orientation information.

Next, calculate values for SDP, $SDP_1^e$, and $SDP_2^e$ on a sampling grid (e.g., a uniform sampling grid) in preparation for a discrete Fourier transform which will be performed later. These calculations can include averaging multiple values of SDP, $SDP_1^e$, and $SDP_2^e$ where each increment in the sampling grid corresponds to multiple values of $x_1$, $x_2$, and $x_3$. Since the $SDP_1^e$, and $SDP_2^e$ parameters are sensitive to changes in stage orientation during the scan, the array containing changes in stage orientation information during the scan is used to correct the $SDP_1^e$ and $SDP_2^e$ parameters to a chosen reference stage orientation.

Next, remove the discontinuities at the domain boundaries between $SDP_1^e$ and SDP, and between SDP and $SDP_2^e$ by adding appropriate constant values to $SDP_1^e$ and $SDP_2^e$. These constant values are $-D_1$ and $D_2$ as given by Equations (48) and (49).

After the discontinuities have been removed, a resultant SDP array is constructed by concatenating the $SDP'_2$, SDP and $SDP_1^e$ arrays. The resultant SDP array spans the length of the mirror to be mapped, L. Next, perform a discrete Fourier transform on the resultant SDP array. Using a complex transfer function calculated for the interferometer being used, transform the SDP Fourier coefficients into the Fourier coefficients for the surface figure error function $\xi(y)$. The surface figure error function, $\xi(y)$, can now be determined from the Fourier coefficients using Equation (13).

In some embodiments, this procedure can be used to determine surface figure error functions for mirrors in a lithography tool at times when the tool is not being used to expose wafers. For example, this procedure can be used during routine maintenance of the tool. At such times, a dedicated scan sequence can be implemented, allowing a portion of a mirror to be scanned at a rate optimized for mirror characterization purposes. Moreover, multiple scans can be performed for different relative distances between the mirror and the interferometer and at different nominal stage orientations, providing a family of ultimate surface figure error functions which can be interpolated for use at other relative distances between the mirror and the interferometer and at other stage orientations.

In embodiments where data is acquired during dedicated scan sequences, the data can be acquired over time periods that are relatively long with respect to various sources of random errors in $x_1$, $x_2$, and $x_3$ measurements. Accordingly, uncertainty in surface figure error functions due to random errors sources can be reduced. For example, one source of random errors are fluctuations in the composition or density of the atmosphere in the interferometer beam paths. Over relatively long time periods, these fluctuations average to zero. Accordingly, acquiring data for calculating SDP and $SDP^e$ values over sufficiently long periods can substantially reduce the uncertainty of $\xi(y)$ due to these non-stationary atmospheric fluctuations.

In certain embodiments where the mirror is to be mapped in situ during, for example, lithography tool operation, arrays of $x_1$, $x_2$, and $x_3$, y position and stage orientation can be accuired and stored to the electronic controller's memory or to disk for specific relative distances and nominal stage orientations. After the arrays of data have been acquired, the remaining steps for mapping the surface figure error function are the same as in an offline analysis. Values for SDP, $SDP_1^e$, and $SDP_2^e$ can be calculated and assigned to a sampling grid (e.g., a uniform sampling grid) in preparation for a discrete Fourier transform which will be performed later. These calculations can include averaging multiple values of SDP, $SDP_1^e$, and $SDP_2^e$ where each increment in the sampling grid corresponds to multiple values of $x_1$, $x_2$, and $x_3$. Since the $SDP_1^e$, and $SDP_2^e$ parameters are sensitive to changes in stage orientation during the scan, the array containing changes in stage orientation information during the scan is used to correct the $SDP_1^e$ and $SDP_2^e$ parameters to a chosen reference stage orientation.

Next, the discontinuities at the domain boundaries between $SDP_1^e$ and SDP, and between SDP and $SDP_2^e$ are removed by adding appropriate constant values to $SDP_1^e$ and $SDP_2^e$. These constant values are $-D_1$ and $D_2$ as given by Equations (48) and (49).

After the discontinuities have been removed, a resultant SDP array is constructed by appropriately concatenating the $SDP_2^e$, SDP and $SDP_1^e$ arrays. The resultant SDP array spans the length of the mirror to be mapped, L. Next, perform a discrete Fourier transform on the resultant SDP array. Using a complex transfer function calculated for the interferometer being used, transform the SDP Fourier coefficients into the Fourier coefficients for the surface figure error function $\xi(y)$. The surface figure error function, $\xi(y)$, can now be determined from the Fourier coefficients using Equation (13).

The surface figure error function may be updated and maintained by computing a running average of the surface figure error function acquired at successive time intervals.

The running average can be stored to the electronic controller's memory or to disk. The optimum time interval which a given average spans can be chosen after determining the time scales over which the surface figure error function $\xi(y)$ significantly changes.

In certain other embodiments, a predetermined surface figure error function $\xi$ can be updated or variations in $\xi$ can be monitored based on values of SDP and/or $SDP^e$'s calculated from newly-acquired interferometry data. For example, in a lithography tool, $x_1$, $x_2$, and $x_3$ values acquired during operation of the tool (e.g., during wafer exposure) can be used to update a mirror's surface figure error function, or can be used to monitor changes in the surface figure error function and provide an indicator of when new full mirror characterizations are required to maintain the interferometry system's accuracy.

In implementations where the surface figure error function is updated during an exposure sequence of a tool, data can be acquired over multiple wafer exposure sequences so that changes that occur to the surface figure error function as a result of systematic changes in the tool that occur each sequence can be distinguished from actual permanent changes in the mirror's characteristics. One example of systematic changes in a tool that may contribute to variations a surface figure error function are stationary changes in the atmosphere in the interferometer's beam paths. Such changes occur for each wafer exposure cycle as the composition and/or gas pressure inside the lithography tool is changed. In the absence of any other technique for monitoring and/or compensating for these effects, they can result in errors in the x1, x2, and x3 measurements that ultimately manifest as errors in the surface figure error function. However, since the changes to the atmosphere are stationary, their effect on $\xi(y)$ can be reduced (e.g., eliminated) by identifying variations that occur to $\xi(y)$ with the same period as the wafer exposure cycle, and subtracting these variations from the correction that is ultimately made to a stage measurement.

The predetermined surface figure error function in the certain other embodiments may be updated by creating a running average of the surface figure error function using the predetermined surface figure error function and surface figure error functions acquired in situ at subsequent time intervals. The subsequent surface figure error functions acquired in situ may be acquired as in the certain embodiments description above. The running average can be stored to the electronic controller's memory or to disk. The optimum time interval which a given average spans can be chosen after determining the time scales over which the surface figure error function $\xi(y)$ significantly changes.

An alternative procedure for updating a predetermined surface figure in the certain other embodiments above may be used. The first step in the alternate procedure is to measure values of $SDP(y,\bar{\theta}_z=0)$ for a section of the x-axis stage mirror. The length of the section or domain is $\geq 4b_3$ and can include the entire length of the stage mirror. Next, integrals of $SDP(y,\bar{\theta}_z=0)$ with weight functions $\cos(s2\pi y/L)$ and $\sin(s2\pi y/L)$ are computed from the measured values of $SDP(y,\bar{\theta}_z=0)$ minus the mean value $\langle SDP(y,\bar{\theta}_z=0)\rangle$ of SDP $(y,\bar{\theta}_z=0)$, $SDP_1^e(y,\bar{\theta}_z=0)-\eta D(y_0)$, and $SDP_2^e(y,\bar{\theta}_z=0)+D(y_0)$, $\langle SDP(y,\bar{\theta}_z=0)\rangle$. The integrals are:

$$A_s'' = \frac{4}{(L-2b_3)} \times \int_{(-\frac{L}{2}+2b_2)}^{[\frac{L}{2}-2(b_3-b_2)]} [SDP(y, \bar{\theta}_z = 0) - \langle SDP(y, \bar{\theta}_z = 0)\rangle]\cos\left(\frac{s2\pi y}{L}\right) dy, \; s \geq 1, \quad (50)$$

$$B_s'' = \frac{4}{(L-2b_3)} \times \int_{(-\frac{L}{2}+2b_2)}^{[\frac{L}{2}-2(b_3-b_2)]} [SDP(y, \bar{\theta}_z = 0) - \langle SDP(y, \bar{\theta}_z = 0)\rangle]\sin\left(\frac{s2\pi y}{L}\right) dy, \; s \geq 1. \quad (51)$$

The integrals expressed by Equations (50) and (51) are evaluated using the series representation of SDP given by Equation (16) with the results $$A_q'' = \frac{4}{(L-2b_3)} \times \int_{(-\frac{L}{2}+2b_2)}^{[\frac{L}{2}-2(b_3-b_2)]} \left[\sum_{m=1}^{N} A_m'\cos\left(\frac{m2\pi y}{L}\right)\cos\left(\frac{q2\pi y}{L}\right) + \sum_{m=1}^{N} B_m'\sin\left(\frac{m2\pi y}{L}\right)\cos\left(\frac{q2\pi y}{L}\right)\right] dy, \; q \geq 1, \quad (52)$$

$$B_q'' = \frac{4}{(L-2b_3)} \times \int_{(-\frac{L}{2}+2b_2)}^{[\frac{L}{2}-2(b_3-b_2)]} \left[\sum_{m=1}^{N} A_m'\cos\left(\frac{m2\pi y}{L}\right)\cos\left(\frac{q2\pi y}{L}\right) + \sum_{m=1}^{N} B_m'\sin\left(\frac{m2\pi y}{L}\right)\cos\left(\frac{q2\pi y}{L}\right)\right] dy, \; q \geq 1. \quad (53)$$

where coefficients $A_q'$ and $B_q'$ are with respect to $SDP(y,\bar{\theta}_z=0)$ with $\langle SDP(y,\bar{\theta}_z=0)\rangle$ subtracted. The evaluation of the integrals in Equation (52) is next performed with the results $$A_q'' = \frac{1}{\left(1 - \frac{2b_3}{L}\right)} \times \left\{ \begin{array}{l} \sum_{m=1}^{N} A_m' \left( \begin{array}{l} \frac{1}{(q+m)2\pi} \left\{ \begin{array}{l} \sin\pi(q+m)\left[1 - 4\frac{(b_3-b_2)}{L}\right] \\ +\sin\pi(q+m)\left[1 - 4\frac{b_2}{L}\right] \end{array} \right\} \\ + \frac{1}{(q-m)2\pi} \left\{ \begin{array}{l} \sin\pi(q-m)\left[1 - 4\frac{(b_3-b_2)}{L}\right] \\ +\sin\pi(q-m)\left[1 - 4\frac{b_2}{L}\right] \end{array} \right\} \end{array} \right) \\ - \sum_{m=1}^{N} B_m' \left( \begin{array}{l} \frac{1}{(q+m)2\pi} \left\{ \begin{array}{l} \cos\pi(q+m)\left[1 - 4\frac{(b_3-b_2)}{L}\right] \\ -\cos\pi(q+m)\left[1 - 4\frac{b_2}{L}\right] \end{array} \right\} \\ - \frac{1}{(q-m)2\pi} \left\{ \begin{array}{l} \cos\pi(q-m)\left[1 - 4\frac{(b_3-b_2)}{L}\right] \\ -\cos\pi(q-m)\left[1 - 4\frac{b_2}{L}\right] \end{array} \right\} \end{array} \right) \end{array} \right\}, q \geq 1, \quad (54)$$

$$A_q'' = A_q' + \frac{1}{\left(1 - \frac{2b_3}{L}\right)} \times \left\{ \begin{array}{l} \sum_{\substack{m=1 \\ m \neq q}}^{N} A_m' \left( \begin{array}{l} \frac{(-1)^{q+m+1}}{(q+m)2\pi} \left\{ \begin{array}{l} \sin\pi(q+m)\left[4\frac{(b_3-b_2)}{L}\right] \\ +\sin\pi(q+m)\left(4\frac{b_2}{L}\right) \end{array} \right\} \\ + \frac{(-1)^{q-m+1}}{(q-m)2\pi} \left\{ \begin{array}{l} \sin\pi(q-m)\left[4\frac{(b_3-b_2)}{L}\right] \\ +\sin\pi(q-m)\left(4\frac{b_2}{L}\right) \end{array} \right\} \end{array} \right) \\ - \sum_{m=1}^{N} B_m' \left( \begin{array}{l} \frac{(-1)^{q-m}}{(q+m)2\pi} \left\{ \begin{array}{l} \cos\pi(q+m)\left[4\frac{(b_3-b_2)}{L}\right] \\ -\cos\pi(q+m)\left[4\frac{b_2}{L}\right] \end{array} \right\} \\ - \frac{(-1)^{q-m}}{(q-m)2\pi} \left\{ \begin{array}{l} \cos\pi(q-m)\left[4\frac{(b_3-b_2)}{L}\right] \\ -\cos\pi(q-m)\left(4\frac{b_2}{L}\right) \end{array} \right\} \end{array} \right) \end{array} \right\}, q \geq 1, \quad (55)$$

$$A_q'' = A_q' + \frac{1}{\left(1 - \frac{2b_3}{L}\right)} \times \left\{ \begin{array}{l} \sum_{\substack{m=1 \\ m \neq q}}^{N} A_m' \left( \begin{array}{l} \frac{(-1)^{q+m+1}}{(q+m)2\pi} \left\{ \begin{array}{l} \sin\left[\frac{2\pi(q+m)}{(1+\eta)}\left(\frac{2b_3}{L}\right)\right] \\ +\sin\left[\frac{2\pi(q+m)\eta}{(1+\eta)}\left(\frac{2b_3}{L}\right)\right] \end{array} \right\} \\ + \frac{(-1)^{q-m+1}}{(q-m)2\pi} \left\{ \begin{array}{l} \sin\left[\frac{2\pi(q-m)}{(1+\eta)}\left(\frac{2b_3}{L}\right)\right] \\ +\sin\left[\frac{2\pi(q-m)\eta}{(1+\eta)}\left(\frac{2b_3}{L}\right)\right] \end{array} \right\} \end{array} \right) \\ - \sum_{m=1}^{N} B_m' \left( \begin{array}{l} \frac{(-1)^{q-m}}{(q+m)2\pi} \left\{ \begin{array}{l} \cos\left[\frac{2\pi(q+m)}{(1+\eta)}\left(\frac{2b_3}{L}\right)\right] \\ -\cos\left[\frac{2\pi(q+m)\eta}{(1+\eta)}\left(\frac{2b_3}{L}\right)\right] \end{array} \right\} \\ - \frac{(-1)^{q-m}}{(q-m)2\pi} \left\{ \begin{array}{l} \cos\left[\frac{2\pi(q-m)}{(1+\eta)}\left(\frac{2b_3}{L}\right)\right] \\ -\cos\left[\frac{2\pi(q-m)\eta}{(1+\eta)}\left(\frac{2b_3}{L}\right)\right] \end{array} \right\} \end{array} \right) \end{array} \right\}, q \geq 1, \quad (56)$$

-continued $$A_q'' = A_q' + \frac{\left(\frac{2b_3}{L}\right)}{\left[1-\left(\frac{2b_3}{L}\right)\right]} \times \left\{ \begin{array}{l} \sum_{\substack{m=1,\\m\neq q}}^{N} A_m' \left[ \begin{array}{l} (-1)^{q+m+1}\left\{\begin{array}{l}\text{sinc}\left[\pi(q+m)\left(\frac{2b_3}{L}\right)\right]\\ \times\cos\left[\pi(q+m)\frac{(\eta-1)}{(\eta+1)}\left(\frac{2b_3}{L}\right)\right]\end{array}\right\} \\ +(-1)^{q-m+1}\left\{\begin{array}{l}\text{sinc}\left[\pi(q-m)\left(\frac{2b_3}{L}\right)\right]\\ \times\cos\left[\pi(q-m)\frac{(\eta-1)}{(\eta+1)}\left(\frac{2b_3}{L}\right)\right]\end{array}\right\} \end{array}\right] + \\ \sum_{m=1}^{N} B_m' \left[ \begin{array}{l} (-1)^{q-m+1}\left\{\begin{array}{l}\text{sinc}\left[\pi(q+m)\left(\frac{2b_3}{L}\right)\right]\\ \times\sin\left[\pi(q+m)\frac{(\eta-1)}{(\eta+1)}\left(\frac{2b_3}{L}\right)\right]\end{array}\right\} \\ -(-1)^{q-m+1}\left\{\begin{array}{l}\text{sinc}\left[\pi(q-m)\left(\frac{2b_3}{L}\right)\right]\\ \times\sin\left[\pi(q-m)\frac{(\eta-1)}{(\eta+1)}\left(\frac{2b_3}{L}\right)\right]\end{array}\right\} \end{array}\right] \end{array} \right\}, q \geq 1. \quad (57)$$

The evaluation of the integrals in Equation (53) is next performed with the results $$B_q'' = \frac{1}{\left(1-\frac{2b_3}{L}\right)} \times \left\{ \begin{array}{l} -\sum_{m=1}^{N} A_m' \left[ \begin{array}{l} \frac{1}{(q+m)2\pi}\left\{\begin{array}{l}\cos\pi(q+m)\left[1-4\frac{(b_3-b_2)}{L}\right]\\ -\cos\pi(q+m)\left[1-4\frac{b_2}{L}\right]\end{array}\right\} \\ +\frac{1}{(q-m)2\pi}\left\{\begin{array}{l}\cos\pi(q-m)\left[1-4\frac{(b_3-b_2)}{L}\right]\\ -\cos\pi(q-m)\left[1-4\frac{b_2}{L}\right]\end{array}\right\} \end{array}\right] \\ +\sum_{m=1}^{N} B_m' \left[ \begin{array}{l} -\frac{1}{(q+m)2\pi}\left\{\begin{array}{l}\sin\pi(q+m)\left[1-4\frac{(b_3-b_2)}{L}\right]\\ +\sin\pi(q+m)\left[1-4\frac{b_2}{L}\right]\end{array}\right\} \\ +\frac{1}{(q-m)2\pi}\left\{\begin{array}{l}\sin\pi(q-m)\left[1-4\frac{(b_3-b_2)}{L}\right]\\ +\sin\pi(q-m)\left[1-4\frac{b_2}{L}\right]\end{array}\right\} \end{array}\right] \end{array} \right\}, q \geq 1, \quad (58)$$

$$B_q'' = B_q' + \frac{1}{\left(1-\frac{2b_3}{L}\right)} \times \left\{ \begin{array}{l} -\sum_{m=1}^{N} A_m' \left[ \begin{array}{l} \frac{(-1)^{q+m}}{(q+m)2\pi}\left\{\begin{array}{l}\cos\pi(q+m)\left[4\frac{(b_3-b_2)}{L}\right]\\ -\cos\pi(q+m)\left[4\frac{b_2}{L}\right]\end{array}\right\} \\ +\frac{(-1)^{q-m}}{(q-m)2\pi}\left\{\begin{array}{l}\cos\pi(q-m)\left[4\frac{(b_3-b_2)}{L}\right]\\ -\cos\pi(q-m)\left[4\frac{b_2}{L}\right]\end{array}\right\} \end{array}\right] \\ +\sum_{\substack{m=1,\\m\neq q}}^{N} B_m' \left[ \begin{array}{l} -\frac{(-1)^{q+m+1}}{(q+m)2\pi}\left\{\begin{array}{l}\sin\pi(q+m)\left[4\frac{(b_3-b_2)}{L}\right]\\ +\sin\pi(q+m)\left[4\frac{b_2}{L}\right]\end{array}\right\} \\ +\frac{(-1)^{q-m+1}}{(q-m)2\pi}\left\{\begin{array}{l}\sin\pi(q-m)\left[4\frac{(b_3-b_2)}{L}\right]\\ +\sin\pi(q-m)\left[4\frac{b_2}{L}\right]\end{array}\right\} \end{array}\right] \end{array} \right\}, q \geq 1 \quad (59)$$

$$B''_q = B'_q + \frac{1}{\left(1 - \frac{2b_3}{L}\right)} \times \qquad (60)$$

$$\begin{cases} -\sum_{m=1}^{N} A'_m \left[ \left( \begin{array}{l} \frac{(-1)^{q+m}}{(q+m)2\pi} \left\{ \begin{array}{l} \cos\left[\frac{1}{(1+\eta)}\left(\frac{2b_3}{L}\right)\right] \\ -\cos\left[\frac{\eta}{(1+\eta)}\left(\frac{2b_3}{L}\right)\right] \end{array} \right\} \\ + \frac{(-1)^{q-m}}{(q-m)2\pi} \left\{ \begin{array}{l} \cos\left[\frac{2\pi(q-m)}{(1+\eta)}\left(\frac{2b_3}{L}\right)\right] \\ -\cos\left[\frac{2\pi(q-m)}{(1+\eta)}\left(\frac{2b_3}{L}\right)\right] \end{array} \right\} \end{array} \right) \right] \\ + \sum_{\substack{m=1,\\m\neq q}}^{N} B'_m \left[ \left( \begin{array}{l} -\frac{(-1)^{q+m+1}}{(q+m)2\pi} \left\{ \begin{array}{l} \sin\left[\frac{1}{(1+\eta)}\left(\frac{2b_3}{L}\right)\right] \\ +\sin\left[\frac{2\pi(q+m)}{(1+\eta)}\left(\frac{2b_3}{L}\right)\right] \end{array} \right\} \\ + \frac{(-1)^{q-m+1}}{(q-m)2\pi} \left\{ \begin{array}{l} \sin\left[\frac{1}{(1+\eta)}\left(\frac{2b_3}{L}\right)\right] \\ +\sin\left[\frac{2\pi(q-m)}{(1+\eta)}\left(\frac{2b_3}{L}\right)\right] \end{array} \right\} \end{array} \right) \right] \end{cases}, q \geq 1$$

$$B''_q = B'_q + \frac{\left(\frac{2b_3}{L}\right)}{\left[1 - \left(\frac{2b_3}{L}\right)\right]} \times \qquad (61)$$

$$\begin{cases} \sum_{\substack{m=1,}}^{N} A'_m \left[ \left( \begin{array}{l} (-1)^{q+m+1} \left\{ \begin{array}{l} \mathrm{sinc}\left[\pi(q+m)\left(\frac{2b_3}{L}\right)\right] \\ \times \sin\left[\frac{(\eta-1)}{(\eta+1)}\left(\frac{2b_3}{L}\right)\right] \end{array} \right\} \\ +(-1)^{q-m+1} \left\{ \begin{array}{l} \mathrm{sinc}\left[\pi(q-m)\left(\frac{2b_3}{L}\right)\right] \\ \times \sin\left[\frac{(\eta-1)}{(\eta+1)}\left(\frac{2b_3}{L}\right)\right] \end{array} \right\} \end{array} \right) \right] \\ + \sum_{\substack{m=1,\\m\neq q}}^{N} B'_m \left[ \left( \begin{array}{l} -(-1)^{q+m+1} \left\{ \begin{array}{l} \mathrm{sinc}\left[\pi(q+m)\left(\frac{2b_3}{L}\right)\right] \\ \times \cos\left[\frac{(\eta-1)}{(\eta+1)}\left(\frac{2b_3}{L}\right)\right] \end{array} \right\} \\ +(-1)^{q-m+1} \left\{ \begin{array}{l} \mathrm{sinc}\left[\pi(q-m)\left(\frac{2b_3}{L}\right)\right] \\ \times \cos\left[\frac{(\eta-1)}{(\eta+1)}\left(\frac{2b_3}{L}\right)\right] \end{array} \right\} \end{array} \right) \right] \end{cases}, q \geq 1.$$

The effects of non-orthogonality of functions $\cos(m2\pi y/L)$ and $\sin(m2\pi y/L)$ over the domain of y in $SDP(y,\bar{\theta}_z=0)$ are evident upon examination of Equations (57) and (61). The effects of non-orthogonality are represented by the differences $(A''_q-A'_q)$ and $(B''_q-B'_q)$ in Equations (57) and (61), respectively.

Equations (57) and (61) can be solved for the $A'_q$ and the $B_q'$, respectively, by an iterative procedure. The degree to shich the effects of non-orthogonality are decoupled from the leading $A'_q$ and $B'_q$ terms in Equations (57) and (61) depends on the ratio $(2b_3/L$. The larger coefficients of "off diagonal terms" in Equations (57) and (61) generally occur for small values |q-m| and the relative magnitude r of the coefficients of these terms is $$r \cong \frac{\left(\frac{2b_3}{L}\right)}{1-\left(\frac{2b_3}{L}\right)} \operatorname{sinc}\left[\pi(q-m)\left(\frac{2b_3}{L}\right)\right]. \tag{62}$$

The iterative procedure is a nontrivial step for which two solutions are given. The step is nontrivial since $\cos(m2\pi y/L)$ and $\sin(m2\pi y/L)$ are functions that are not orthogonal as a set over the domain of integration in y. One solution involves using a surface figure error function $\xi$ obtained at an earlier time based on measured values of SDP, $SDP_1^e$, and $SDP_2^e$ to compute values for the off-diagonal terms in Equations (57) and (61).

Alternatively, or additionally, information about a surface figure error function can be obtained using other techniques, such as based on values of a FDP such as given by Equation (3) or from interferometric measurements made ex-situ, e.g., a Fizeau interferometer, before the stage mirror is installed in a lithography tool.

The resulting values for $A'_m$ and $B'_m$ may be used without any iteration if the resulting values for $A'_m$ and $B'_m$ indicate that there has not been any significant change in the surface figure error function $\xi$. If there has been a significant change, the resulting values for $A'_m$ and $B'_m$ are used as input information to compute the off-diagonal terms in a second step of the iterative procedure. The iterative steps are repeated until stable, i.e., asymptotic, values for $A'_m$ and $B'_m$ are obtained. The values for $A_m$ and $B_m$ are subsequently obtained using Equations (17) and (18) from the coefficients $A'_m$ and $B'_m$ produced by the iterative procedure.

After the surface figure error function $\xi(y,\theta_z=0)$ is determined for the specified section of the x-axis stage mirror, the procedure can be repeated for other sections of the x-axis stage mirror that are used in the respective lithography tool.

In some embodiments, measured values of SDP can be used to extend a known surface figure error function $\xi$ to other sections of the x-axis stage mirror. Equation (7) allows the generation of figure error function $\xi(y,\theta_z=0)$ for the other sections of the x-axis stage mirror from the known surface figure error function $\xi(y,\theta_z=0)$ in an adjacent section of the x-axis stage mirror.

In certain embodiments, local spatial derivatives of a surface figure error function can be measured using the methods disclosed herein, in some cases, with relatively high sensitivity. The sensitivity of the third order term represented by the last term in Equation (16) is proportional to m and is equal, for example, to the sensitivity of the remaining first order terms in Equation (16) for m≈100 for $|\theta_z|$=0.5 milliradians and x=0.7. To measure the local spatial derivatives directly or with a higher sensitivity, the procedure described for the determination of $\xi(y,\theta_z=0)$ can be repeated for non-zero values of $\theta_z$ and for large values of x and y for the x-axis and y-axis stage mirrors, respectively.

The surface figure error function $\xi(y,\bar{\theta}_z=0)$ obtained in the above described procedures includes in particular information about $\xi(y,\bar{\theta}_z=0)$ that is quadratic in y. However, the surface figure error function $\xi(y,\bar{\theta}_z=0)$ obtained in the above described procedure does not represent any error in $\xi(y,\bar{\theta}_z=0)$ that is linear in y since SDP is zero for a plane mirror surface.

The error in the determined $\xi(y,\bar{\theta}_z=0)$ linear in y relative to the error in the determined $\xi(y,\bar{\theta}_z=0)$ linear in x for the x-axis and the y-axis stage mirrors, respectively, i.e., a differential error, is the only portion of the linear error that is relevant. A common mode error corresponds to a rotation of the stage. The differential error is related to the angle between the x-axis and y-axis stage mirrors and the effect of the differential error is compensated by measuring the angle between the two stage mirrors. The angle between the two stage mirrors can be measured by use of an artifact wafer and the artifact wafer rotated by 90 degrees for each plane defined by the multiple-axes/plane interferometers.

It is the information about the angles between the two stage mirrors that is used for compensating surface figure error functions in yaw. Additional information about the respective surface figure error functions may also be obtained by introducing a displacement of the second pass measurement beams at the stage mirror by changing the orientation of the stage mirror to change the respective pitch and repeating the procedures described herein to determine the surface figure error functions at the position of the sheared measurement beams.

If the mean value $<SDP(y,\bar{\theta}_z=0)>$ is not subtracted from measured values of $SDP(y,\bar{\theta}_z=0)$, information about the quadratic term in the representation of the surface figure error function may be lost. This is because the mean value of the measured values of $SDP(y,\bar{\theta}_z=0)$ represents an error in $4(y,\bar{\theta}_z=0)$ that is quadratic in y and an offset error due to offset errors in the linear displacements $x_1$, $x_2$, and $x_3$. As a consequence, the error in the determined $\xi(\bar{\theta}_z=0)$ that is quadratic in y is measured by an independent procedure such as use of an artifact wafer and the artifact wafer rotated by 180 degrees.

Values of $\theta_z(y)$ are measured by the y-axis interferometer. During a scan of the x-axis mirror, typically there is nominally no change in the location stage in the x direction. Accordingly, there is no change in the nominal location of the measurement beams of the y-axis interferometer on the surface of the corresponding y-axis stage mirror. However, the relative scales of the measurement axes of the y-axis interferometer used to measure $\theta_z(y)$ will not, in general, be identical and furthermore may be a function of y. The respective scales may be different due to geometric effects such as described in commonly owned U.S. patent application Ser. No. 10/872,304 entitled "COMPENSATION FOR GEOMETRIC EFFECTS OF BEAM MISALIGNMENTS IN PLANE MIRROR INTERFEROMETER METROLOGY SYSTEMS" or due to stationary systematic changes in the density gradients of the gas in the y-axis interferometer measurement beam paths.

Such errors due to relative scale errors can be difficult to measure and are typically done using an artifact wafer. However, measured values of the SDP and values of SDP reconstructed from the derived mirror surface figure error function can be used to test to see if such errors are present and if so, measure the y dependence of the relative scale errors that are quadratic and higher order in terms of y. Over time scales short compared to the time scales for changes in $(E_1 - E_3)$, the difference between measured values of SDP and values of SDP reconstructed from the derived mirror surface figure error function are obtained as a function of y. Relative scaling errors in the y axes interferometer measurements which result in $\theta_z(y)$ having a quadratic error term with respect to y can be identified as a term linear in y for the difference between measured and reconstructed values of SDP. Similarly errors in $\theta_z(y)$ which are cubic and higher order with respect to y can be identified as quadratic and higher order terms in y for the difference between measured and reconstructed values of SDP.

The procedure described for determining and compensating errors in the measured values of $\theta_z(y)$ also include compensating the effects of stationary effects of the gas in the respective measurement and reference beam paths The surface figure error function for an x-axis stage mirror will, in general, be a function of both y and z and the surface figure error function for the y-axis stage mirror will in general be a function of both x and z. The generalization to cover the z dependent properties is subsequently addressed by the use of a two three-axis/plane interferometer system in conjunction with a procedure to measure the angle between the x-axis and y-axis stage mirrors in two different parallel planes corresponding to the two planes defined by the two three-axis/plane interferometer system.

Once determined, surface figure error functions are typically used to compensate interferometry system measurements, thereby improving an interferometry system's accuracy. For example, $\xi(y)$ can be used to compensate measurements of the position of an x-axis stage mirror along, e.g., axis $x_1$ for a position y based on the following equations. If d is the true x-axis displacement of the stage mirror and $\xi'(y)$ is the true surface figure error function, an uncorrected measurement at position y, will give, for example, $$\tilde{x}_1(y) = d + \left(\frac{\xi'_1(y) + \xi'_0(y)}{2}\right) + d_{nom}\theta_z\left(\frac{\partial \xi'_1}{\partial y} - \frac{\partial \xi'_0}{3 \partial y}\right), \quad (63)$$

where $\xi'_1$ and $\xi'_0$ refer to the surface figure error function values at positions $x'_1$ and $x'_0$, respectively, and $d_{nom}$ is a nominal displacement value used to calculate the geometric error term that occurs for non-zero $\theta_z$.

Using the surface figure error function, a compensated displacement $x_c(y)$ can be calculated from the measured displacement based on the following equation:

$$x_c(y) = \tilde{x}_1(y) - \left(\frac{\xi_1(y) + \xi_0(y)}{2}\right) - d_{nom}\theta_z\left(\frac{\partial \xi_1}{\partial y} - \frac{\partial \xi_0}{1 \partial y}\right). \quad (64)$$

In embodiments, various other error compensation techniques can be used to reduce other sources of error in interferometer measurements. For example, cyclic errors that are present in the linear displacement measurements can be reduced (e.g., eliminated) and/or compensated by use of one of more techniques such as described in commonly owned U.S. patent application Ser. No. 10/097,365, entitled "CYCLIC ERROR REDUCTION IN AVERAGE INTERFEROMETRIC MEASUREMENTS," and U.S. patent application Ser. No. 10/616,504 entitled "CYCLIC ERROR COMPENSATION IN INTERFEROMETRY SYSTEMS," which claims priority to Provisional Patent Application No. 60/394,418 entitled "ELECTRONIC CYCLIC ERROR COMPENSATION FOR LOW SLEW RATES," all of which are by Henry A. Hill and the contents of which are incorporated herein in their entirety by reference.

An example of another cyclic error compensation technique is described in commonly owned U.S. patent application Ser. No. 10/287,898 entitled "INTERFEROMETRIC CYCLIC ERROR COMPENSATION," which claims priority to Provisional Patent Application No. 60/337,478 entitled "CYCLIC ERROR COMPENSATION AND RESOLUTION ENHANCEMENT," by Henry A. Hill, the contents of which are incorporated herein in their entirety by reference.

Another example of a cyclic error compensation technique is described in U.S. patent application Ser. No. 10/174,149 entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," which claims priority to Provisional Patent Application No. 60/303,299 entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," both by Henry A. Hill and Peter de Groot, the contents both of which are incorporated herein in their entirety by reference.

A further example of a cyclic error compensation technique is described in commonly owned Provisional Patent Application No. 60/314,490 filed entitled "TILTED INTERFEROMETER," by Henry A. Hill, the contents of which is herein incorporated in their entirety by reference.

Other techniques for cyclic error compensation include those described in U.S. Pat. No. 6,137,574 entitled "SYSTEMS AND METHODS FOR CHARACTERIZING AND CORRECTING CYCLIC ERRORS IN DISTANCE MEASURING AND DISPERSION INTERFEROMETRY;" U.S. Patent No. U.S. Pat. No. 6,252,668 B1, entitled "SYSTEMS AND METHODS FOR QUANTIFYING NON-LINEARITIES IN INTERFEROMETRY SYSTEMS;" and U.S. Pat. No. 6,246,481, entitled "SYSTEMS AND METHODS FOR QUANTIFYING NONLINEARITIES IN INTERFEROMETRY SYSTEMS," wherein all three are by Henry A. Hill, the contents of the three above-cited patents and patent applications are herein incorporated in their entirety by reference.

Improved statistical accuracy in measured values of SDP can be obtained by taking advantage of the relatively low bandwidth of measured values of SDP compared to the bandwidth of the corresponding linear displacement measurements using averaging or low pass filtering. The relatively low bandwidth arises because of SDP invariance with respect to displacements of the mirror along the measurement axes and it invariance (at least to second order) on rotations of the mirror. Variations in SDP occur primarily as a result of variations of the mirror surface figure as the mirror is scanned orthogonally to the measurement axes, which depends on the mirror scan speed, but generally occurs at much lower rates than the sampling rates of the detectors used in the three-axis/plane interferometer. For example, where the $1/e^2$ beam diameter is 5 mm and the stage is scanned at a rate of 0.5 m/s, the bandwidth of measured values of SDP will be of the order of 100 Hz compared to typical sampling rates of the respective detectors of the order of 10 MHz.

The effects of offset errors in the measured values of SDP can be measured by use of an artifact wafer and the artifact wafer rotated by 180 degrees and the offset error effects compensated. Offset errors arise in SDP because SDP is derived from three different interferometer measurements where each of the three interferometers can only measure relative changes in a respective reference and measurement beam paths. In addition, the offset errors may change with time because the calibrations of each of the three interferometers may change with respect to each other, e.g. due to changes in temperature. An artifact wafer is a wafer that includes several alignment marks that are precisely spaced with respect to each other. Accordingly, a metrology system can be calibrated by locating the marks with the system's alignment sensor and comparing the displacement between each alignment mark as measured using the metrology system with the known displacement. Because of offset errors in the interferometer distance measurements and because the angle between the measurement axes of the x-axis and y-axis interferometers is not generally known, the angle between the x-axis and y-axis stage mirrors should be independently measured. This angle can be measured in one or more planes according to whether interferometer system 10 comprises one or two three-axis/plane interferometers by use of an artifact wafer and the artifact wafer rotated by 90 degrees.

While the foregoing description is with regard to a particular interferometer assembly, namely interferometer 100, in general, other assemblies can also be used to obtain values for SDP and other parameters. For example, in some embodiments, an interferometer assembly can be configured to monitor the position of a measurement object along more than three coplanar axes (e.g., four or more axes, five or more axes). Moreover, while interferometer includes non-coplanar measurement axes, other embodiments can include exclusively coplanar axes. Furthermore, the relative position of the common measurement beam path is not limited to the position in interferometer 100. For example, in some embodiments, the common measurement beam path can be an outermost path, instead of being flanked by beam paths on either side within the common plane.

In certain embodiments, individual, rather than compound, optical components can be used. For example, freestanding beam splitters can be used to divide the first path measurement beam into the other measurement beams. Such a configuration may allow one to adjust the relative spacing of the beams, and hence the relative spacing of the measurement axes in a multi-axis interferometer.

In some embodiments, multiple single axis interferometers can be used instead of a multi-axis interferometer. For example, a three-axis/plane interferometer can be replaced by three single axis interferometers (e.g., high stability plane mirror interferometers), arranged so that each interferometer's axis lies in a common plane.

As discussed previously, lithography tools are especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50–100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry metrology systems, such as those discussed previously, are important components of the positioning mechanisms that control the position of the wafer and reticle, and register the reticle image on the wafer. If such interferometry systems include the features described above, the accuracy of distances measured by the systems can be increased and/or maintained over longer periods without offline maintenance, resulting in higher throughput due to increased yields and less tool downtime.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 4:
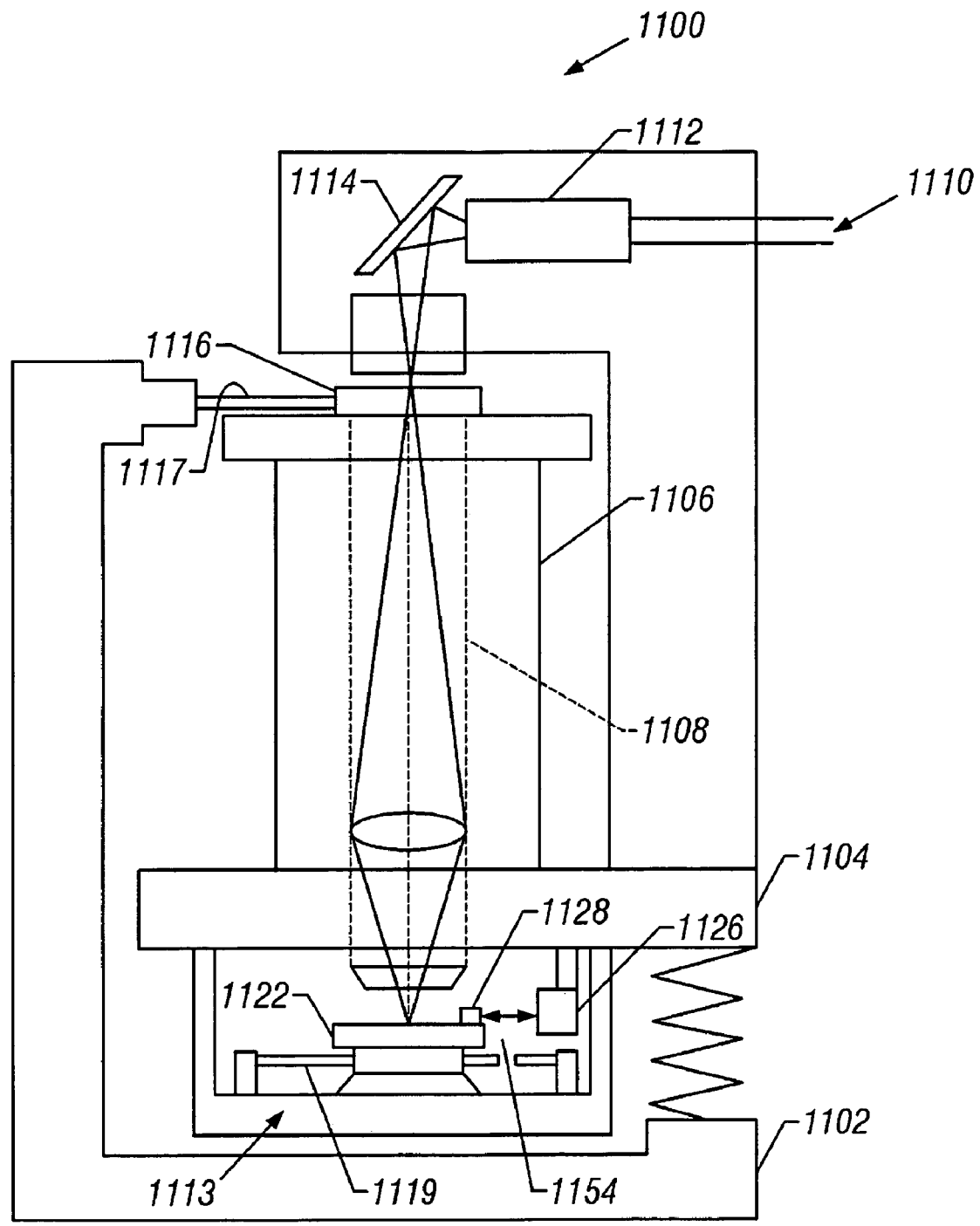
FIG. 4 is a schematic diagram of an embodiment of a lithography tool that includes an interferometer.

Another example of a lithography tool 1100 using an interferometry system 1126 is shown in FIG. 4. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithozraphy: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 5A:
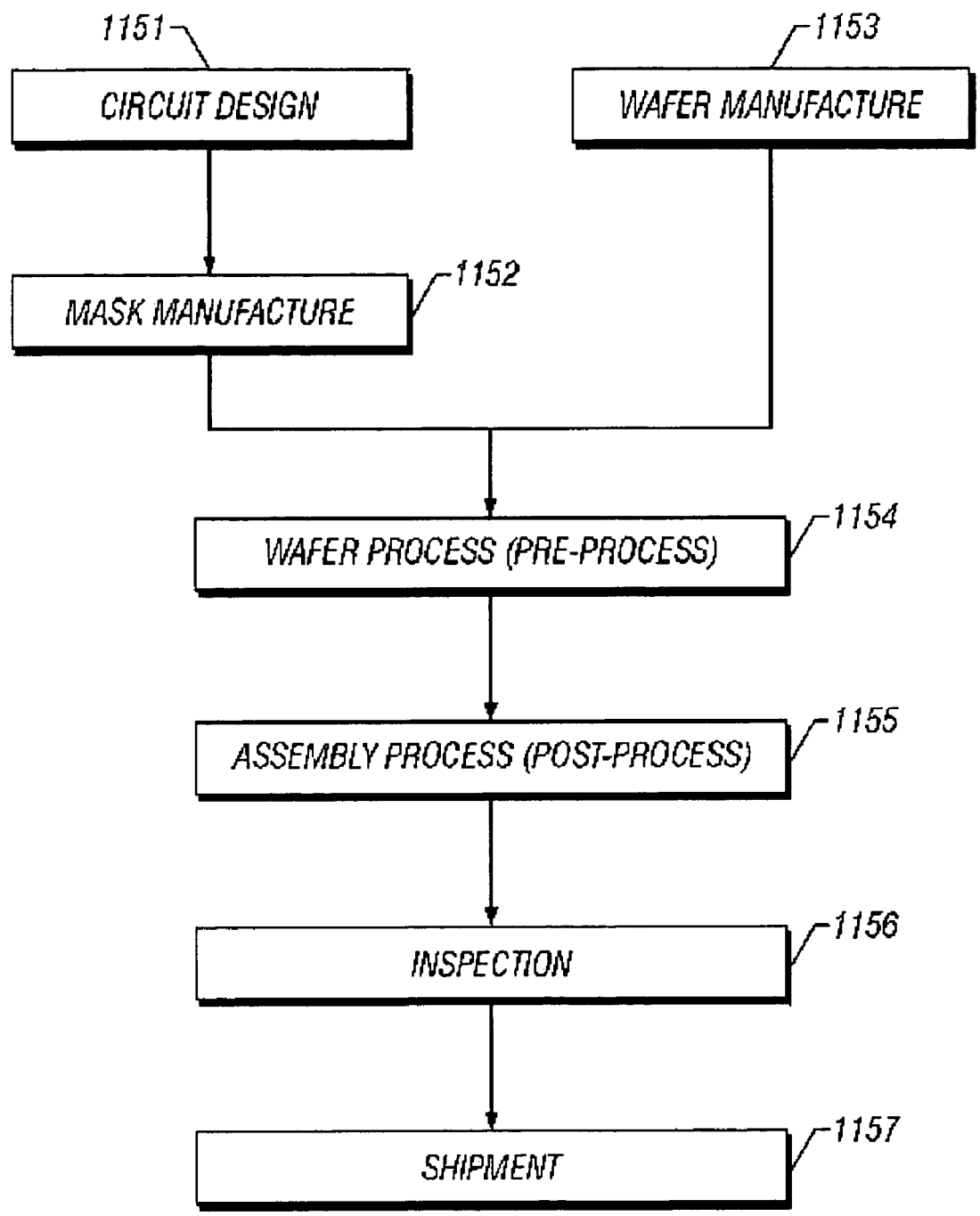
FIG. 5a and FIG. 5b are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 5*a* and 5*b*. FIG. 5*a* is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 5B:
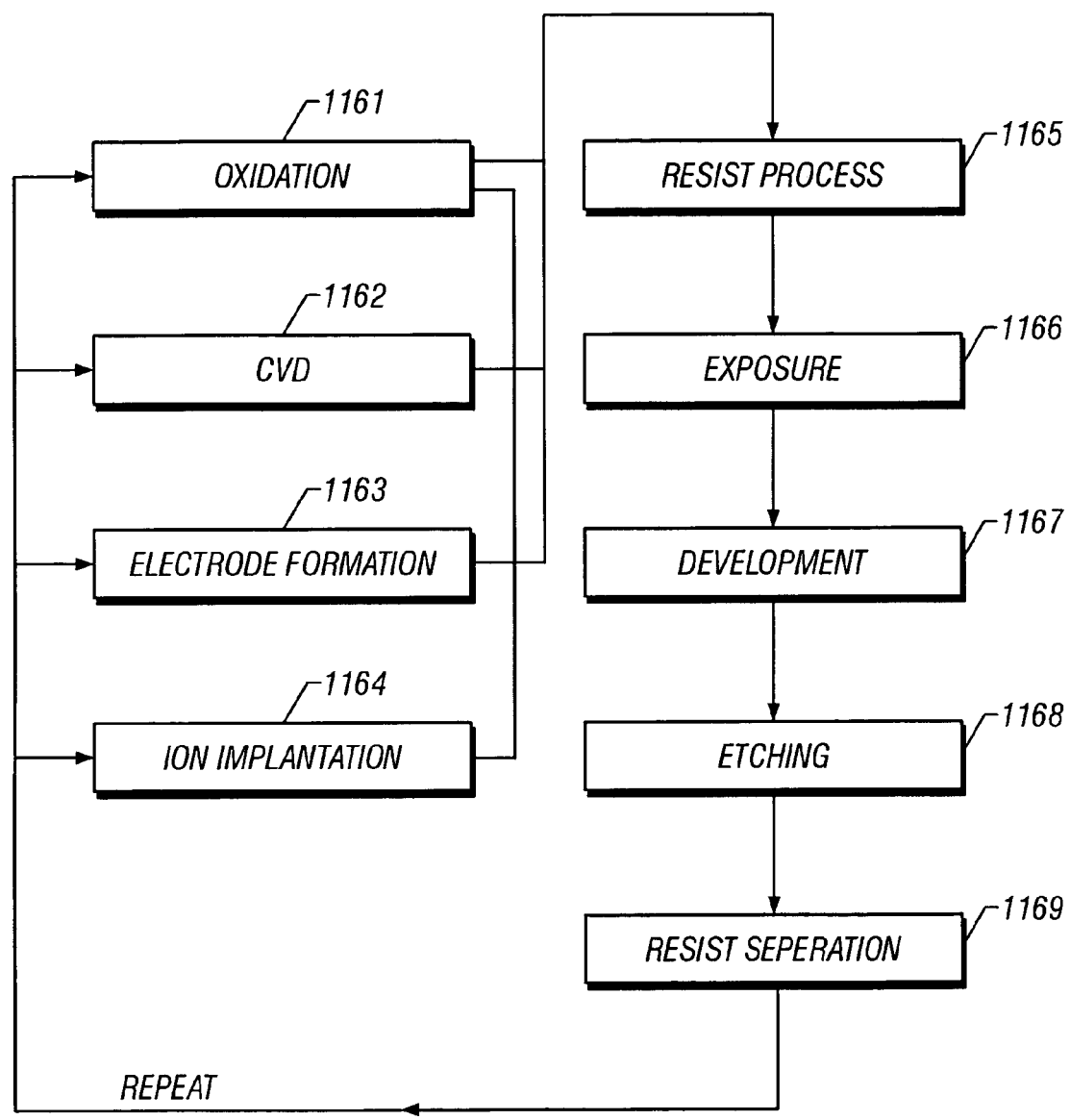

FIG. 5*b* is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 6:
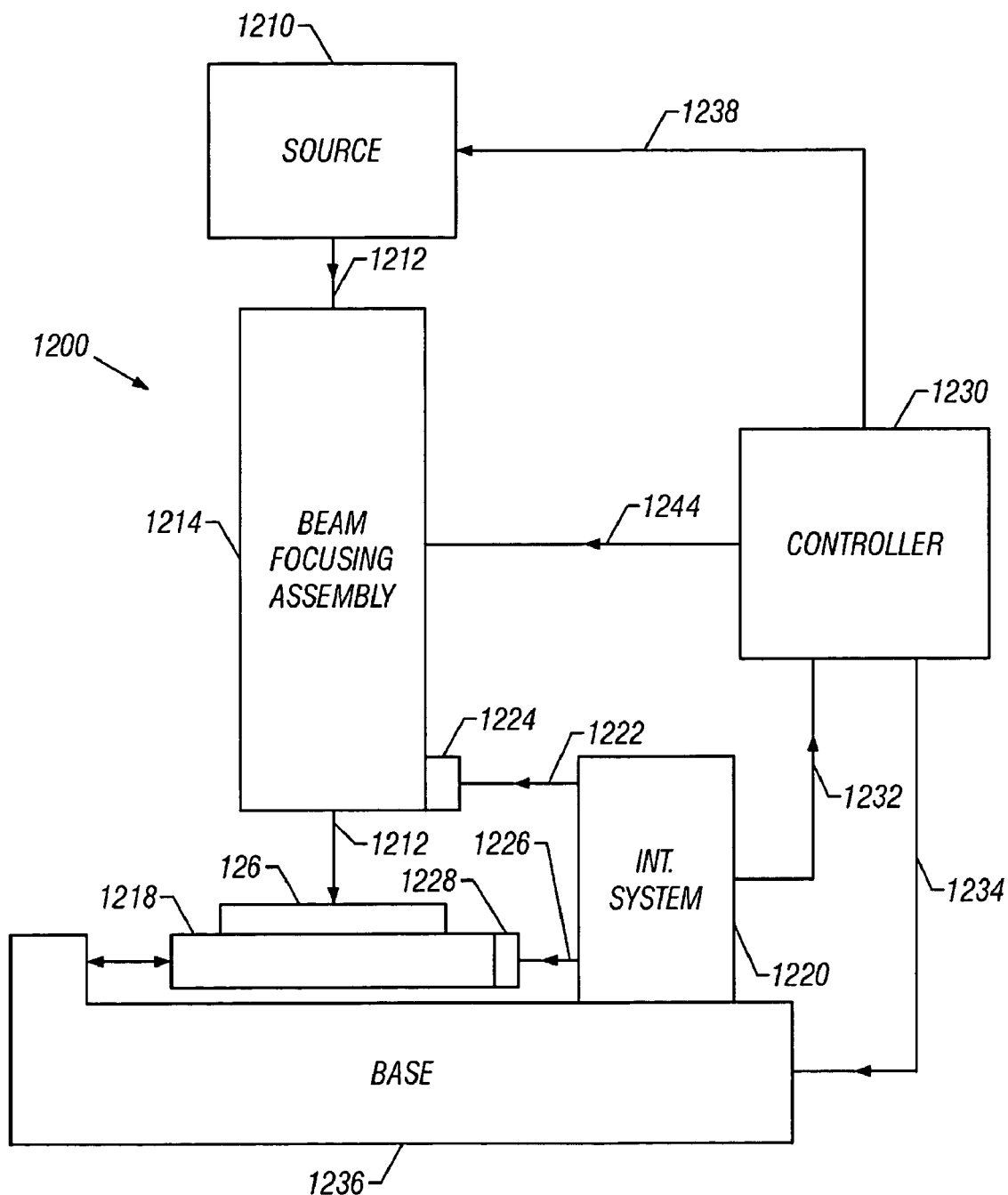
FIG. 6 is a schematic of a beam writing system that includes an interferometry system.

As an example, a schematic of a beam writing system 1200 is shown in FIG. 6. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method, comprising:
   interferometrically monitoring a distance between an interferometry assembly and a measurement object along each of three different measurement axes while moving the measurement object relative to the interferometry assembly;
   determining values of a parameter for different positions of the measurement object from the monitored distances, wherein for a given position the parameter is based on the distances of the measurement object along each of the three different measurement axes at the given position; and
   deriving information about a surface figure profile of the measurement object from a frequency transform of at least the parameter values.

2. The method of claim 1, wherein the frequency transform is a Fourier transform.

3. The method of claim 2, wherein the Fourier transform is a discrete Fourier transform.

4. The method of claim 2, deriving information about the surface figure profile of the measurement object comprises determining Fourier coefficients for a function characterizing the surface figure profile.

5. The method of claim 1, wherein the information about the surface figure profile is derived from a frequency transform of values of a second parameter, wherein for a given position the second parameter is based on the monitored distances of the measurement object along each of two of the measurement axes at the given position.

6. The method of claim 5, wherein the second parameter is also based on the monitored distance of the measurement object along one of the measurement axes at another position.

7. The method of claim 6, wherein determining the value of the second parameter for each position of the measurement object includes calculating a difference between the monitored distance along two of the measurement axes for multiple different positions of the measurement object.

8. The method of claim 1, wherein monitoring the distance between the interferometry assembly and the measurement object comprises simultaneously measuring a location of the measurement object along each of the measurement axes for each of the different positions of the measurement object.

9. The method of claim 1, further comprising determining values of a third parameter for different positions of the measurement object, wherein for each position the third parameter is based on the distance of the measurement object along each of two of the measurement axes at that position and the distance of the measurement object along one of the measurement axes at another position.

10. The method of claim 1, further comprising using the information about the surface figure profile of the measurement object to improve the accuracy of measurements made using the interferometry assembly.

11. The method of claim 1, further comprising using a lithography tool to expose a substrate with radiation passing through a mask while interferometrically monitoring the distance between the interferometry assembly and the measurement object, wherein the position of the substrate or the mask relative to a reference frame is related to the distance between the interferometry assembly and the measurement object.

12. The method of claim 1, wherein the interferometer assembly or the measurement object are attached to a stage and at least one of the monitored distances is used to monitor the position of the stage relative to a frame supporting the stage.

13. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using the measurement object and using the information about the surface figure profile of the measurement object derived using the method of claim 1 to improve the accuracy of the monitored position of the stage.

14. A lithography method for use in the fabrication of integrated circuits comprising:
directing input radiation through a mask to produce spatially patterned radiation;
positioning the mask relative to the input radiation;
monitoring the position of the mask relative to the input radiation using the measurement object and using the information about the surface figure profile of the measurement object derived using the method of claim 1 to improve the accuracy of the monitored position of the mask; and
imaging the spatially patterned radiation onto a wafer.

15. A lithography method for fabricating integrated circuits on a wafer comprising:
positioning a first component of a lithography system relative to a second component of a lithography system to expose the wafer to spatially patterned radiation; and
monitoring the position of the first component relative to the second component using the measurement object and using the information about the surface figure profile of the measurement object derived using the method of claim 1 to improve the accuracy of the monitored position of the first component.

16. A method for fabricating integrated circuits, the method comprising the lithography method of claim 13.

17. A method for fabricating integrated circuits, the method comprising the lithography method of claim 14.

18. A method for fabricating integrated circuits, the method comprising the lithography method of claim 15.

19. A method for fabricating a lithography mask, the method comprising:
directing a write beam to a substrate to pattern the substrate;
positioning the substrate relative to the write beam; and
monitoring the position of the substrate relative to the write beam using the measurement object and using the information about the surface figure profile of the measurement object derived using the method of claim 1 to improve the accuracy of the monitored position of the substrate.

20. The method of claim 1,further comprising moving the measurement object relative to the interferometry assembly in response to the output signal.

21. The method of claim 1, wherein the output signal is used to provide the information about the surface figure profile to an electronic controller's memory or to disk.

22. An apparatus, comprising:
a interferometer assembly configured to produce three output beams each including interferometric information about a distance between the interferometer and a measurement object along a respective axis; and
an electronic processor configured to determine values of a parameter or different positions of the measurement object from the interferometric information, wherein for a given position the parameter is based on the distances of the measurement object along each of the respective measurement axes at the given position,
the electronic processor being further configured to derive information about a surface figure profile of the measurement object from a frequency transform of at least the parameter values.

23. The apparatus of claim 22, wherein the measurement object is a plane mirror measurement object.

24. The apparatus of claim 22, wherein the three output beams each include a component that makes one pass to the measurement object along a common beam path.

25. The apparatus of claim 22, wherein the measurement axes are co-planar.

26. The apparatus of claim 22, wherein the measurement axes are parallel.

27. The apparatus of claim 22, further comprising a stage and wherein the interferometer assembly or measurement object are attached to the stage.

28. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the apparatus of claim 22 for monitoring the position of the wafer relative to the imaged radiation.

29. A lithography system for use in fabricating integrated circuits on a wafer, the system comprising:
a stage for supporting the wafer; and
an illumination system including a radiation source, a mask, a positioning system, a lens assembly, and the apparatus of claim 22,
wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

30. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the apparatus of claim 22 for monitoring the position of the stage relative to the beam directing assembly.

31. A method for fabricating integrated circuits, the method comprising:
applying a resist to a wafer;
forming a pattern of a mask in the resist by exposing the wafer to radiation using the lithography system of claim 28; and
producing an integrated circuit from the wafer.

32. A method for fabricating integrated circuits, the method comprising:
applying a resist to a wafer;
forming a pattern of a mask in the resist by exposing the wafer to radiation using the lithography system of claim 29; and
producing an integrated circuit from the wafer.

* * * * *